(12) United States Patent
Ahn et al.

(10) Patent No.: US 10,499,508 B2
(45) Date of Patent: Dec. 3, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Seong Sik Ahn, Yongin-si (KR); Min Ki Kim, Hwaseong-si (KR); Ki Jong Kim, Chungcheongbuk-do (KR); Seung Hwan Baek, Seoul (KR); In Su Baek, Seoul (KR)

(73) Assignee: Samsung Display Co., Ltd. (KR)

( * ) Notice: Subject to any disclaimer, the term of this patent is extended or adjusted under 35 U.S.C. 154(b) by 18 days.

(21) Appl. No.: 15/861,559

(22) Filed: Jan. 3, 2018

(65) Prior Publication Data

US 2019/0014664 A1 Jan. 10, 2019

(30) Foreign Application Priority Data

Jul. 7, 2017 (KR) .......................... 10-2017-0086715

(51) Int. Cl.
*H05K 1/14* (2006.01)
*H01L 27/32* (2006.01)
(Continued)

(52) U.S. Cl.
CPC ....... *H05K 1/147* (2013.01); *G02F 1/133345* (2013.01); *G06F 3/044* (2013.01); *G06F 3/0412* (2013.01); *G06F 3/0416* (2013.01); *H01L 27/323* (2013.01); *H01L 27/3276* (2013.01); *H05K 1/0271* (2013.01); *H05K 3/361* (2013.01); *G02F 1/1368* (2013.01); *G02F 1/13338* (2013.01); *G02F 1/13452* (2013.01);
(Continued)

(58) Field of Classification Search
CPC ......... G02F 1/133305; G02F 1/133345; G02F 1/13338; G02F 1/13452; G02F 1/1368; G06F 3/0412; G06F 3/0416; G06F 3/044; G06F 2203/04103; G06F 2203/04105; G06F 2203/04111; H01L 27/323; H01L 27/3276; H01L 2227/323; H01L 2251/5338; H01L 51/5253; H05K 1/0271; H05K 1/147; H05K 3/361; H05K 2201/055; H05K 2201/056; H05K 2201/10128; H05K 2201/10136
See application file for complete search history.

(56) References Cited

U.S. PATENT DOCUMENTS

2018/0067614 A1\* 3/2018 Hong ...................... G06F 3/044

FOREIGN PATENT DOCUMENTS

KR 10-2010-0106669 A 10/2010
KR 10-2014-0118676 A 10/2014

\* cited by examiner

*Primary Examiner* — Nelson M Rosario
(74) *Attorney, Agent, or Firm* — Innovation Counsel LLP

(57) ABSTRACT

A display device is provided. The display device includes: an input sensing member electrically connected to a first bonding pad unit having a first pad; a pressure sensing member electrically connected to a second bonding pad having a second pad; and a display panel disposed between the input sensing member and the pressure sensing member, wherein the first pad is electrically connected to the second pad, a first offset distance between the first and second pads is greater than zero, and the first offset distance is defined as a spacing distance, on a plane, between a side of the first pad and a side of the second pad when the first and second pads are yet to be electrically connected.

20 Claims, 20 Drawing Sheets

(51) Int. Cl.
  *G02F 1/1333* (2006.01)
  *H05K 1/02* (2006.01)
  *H05K 3/36* (2006.01)
  *G06F 3/044* (2006.01)
  *G06F 3/041* (2006.01)
  *H01L 51/52* (2006.01)
  *G02F 1/1345* (2006.01)
  *G02F 1/1368* (2006.01)

(52) U.S. Cl.
  CPC .................. *G02F 1/133305* (2013.01); *G06F 2203/04103* (2013.01); *G06F 2203/04105* (2013.01); *G06F 2203/04111* (2013.01); *H01L 51/5253* (2013.01); *H01L 2227/323* (2013.01); *H01L 2251/5338* (2013.01); *H05K 2201/055* (2013.01); *H05K 2201/056* (2013.01); *H05K 2201/10128* (2013.01); *H05K 2201/10136* (2013.01)

DISPLAY DEVICE AND MANUFACTURING METHOD THEREOF

This application claims priority from and the benefit of Korean Patent Application No. 10-2017-0086715, filed on Jul. 7, 2017, which is hereby incorporated by reference for all purposes as if fully set forth herein.

BACKGROUND

1. Field

The present disclosure relates to a display device and a manufacturing method thereof.

2. Description of the Related Art

Display devices have increasingly become important in accordance with developments in multimedia technology. Accordingly, various types of display devices such as a liquid crystal display (LCD) device, an organic light-emitting display device, etc. have been used.

The LCD device, which is one of the most widely-used flat panel displays, includes two substrates on which field-generating electrodes such as pixel electrodes and a common electrode are formed and a liquid crystal layer which is interposed between the two substrates. The LCD device forms an electric field in the liquid crystal layer by applying voltages to the field-generating electrodes so as to determine the orientation of liquid crystal molecules in the liquid crystal layer, and displays an image by controlling the polarization of light incident thereupon using the electric field.

The organic light-emitting display device displays an image using organic light-emitting diodes (OLEDs), which generate light through the recombination of electrons and holes. The organic light-emitting display device has many advantages such as fast response speed, high luminance, large viewing angle, and low power consumption.

SUMMARY

Exemplary embodiments of the present disclosure provide a display device capable of reducing the formation of cracks during folding that follows the bonding of flexible printed circuits (FPCs) and a manufacturing method of the display device.

Exemplary embodiments of the present disclosure also provide a display device capable of reducing the phenomenon of pad units being lifted off during folding that follows the bonding of FPCs and a manufacturing method of the display device.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present inventive concept discloses A display device, comprising: an input sensing member electrically connected to a first bonding pad unit, the first bonding pad unit having a first pad; a pressure sensing member electrically connected to a second bonding pad unit, the second bonding pad unit having a second pad; and a display panel disposed between the input sensing member and the pressure sensing member. The first pad may be configured to be electrically connected to the second pad, a first offset distance between the first and second pads may be greater than zero, and the first offset distance may be defined as a spacing distance, on a plane, between a side of the first pad and a side of the second pad when the first and second pads are not be electrically connected.

According to an exemplary embodiment of the present inventive concept also discloses a display device, comprising: a display panel; an input sensing member disposed above the display panel and including a first bonding pad unit having a first pad; and a pressure sensing member disposed below the display panel and including a second bonding pad unit having a second pad, is the second pad configured to be electrically connected to the first pad. A first length from an imaginary line, extended from a side of the display panel in an upward direction of the display panel, to the first pad may be smaller than a second length from the imaginary line to the second pad.

The display device may have wherein a length from an imaginary line, extended from a side of the display panel in an upward direction of the display panel, to the first pad is smaller than a length from the imaginary line to the second pad.

The display device may have wherein the first offset distance is 500 um to 1000 um.

The display device may have wherein a second offset distance between the first and second pads is zero, and the second offset distance is defined as a spacing distance, on the plane, between the side of the first pad and the side of the second pad when the first and second pads are electrically connected.

The display device may further comprise a first flexible printed circuit (FPC) on which the first bonding pad unit is disposed; and a second FPC on which the second bonding pad unit is disposed, wherein the second FPC is configured to have a bent portion when the first and second bonding pad are not folded.

The display device may have wherein the second FPC is configured not to have the bent portion when the first and second bonding pad are not folded.

The display device may have wherein the first and second pads are electrically connected by hot bar bonding.

The display device may further comprise: a plurality of pixel units disposed on a display area; and an encapsulation member disposed to cover the pixel units, wherein the encapsulation member either includes at least one of an organic layer and an inorganic layer or is a glass insulating substrate.

The display device may have wherein the display panel is one of an organic light-emitting display panel and a liquid crystal display (LCD) panel.

The display device may have wherein the display panel includes a substrate having a display area configured to display an image and a non-display area adjacent to the display area; the display panel further includes a bending area disposed on the substrate and overlapping with the non-display area; and the substrate is bent along an imaginary bending axis disposed in the bending area.

According to an exemplary embodiment of the present inventive concept discloses a manufacturing method of a display device, comprising: preparing an input sensing member electrically connected to a first bonding pad unit having a first pad, a pressure sensing member electrically connected to a second bonding pad having a second pad, the second pad being spaced apart from the first pad on a plane, and a display panel disposed between the input sensing member and the pressure sensing member; electrically connecting the first and second pads; and folding the first and second pads that are electrically connected.

According to the aforementioned and other exemplary embodiments of the present disclosure, cracks that may be formed in FPCs can be reduced.

In addition, the phenomenon of pad units being lifted off can be reduced.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
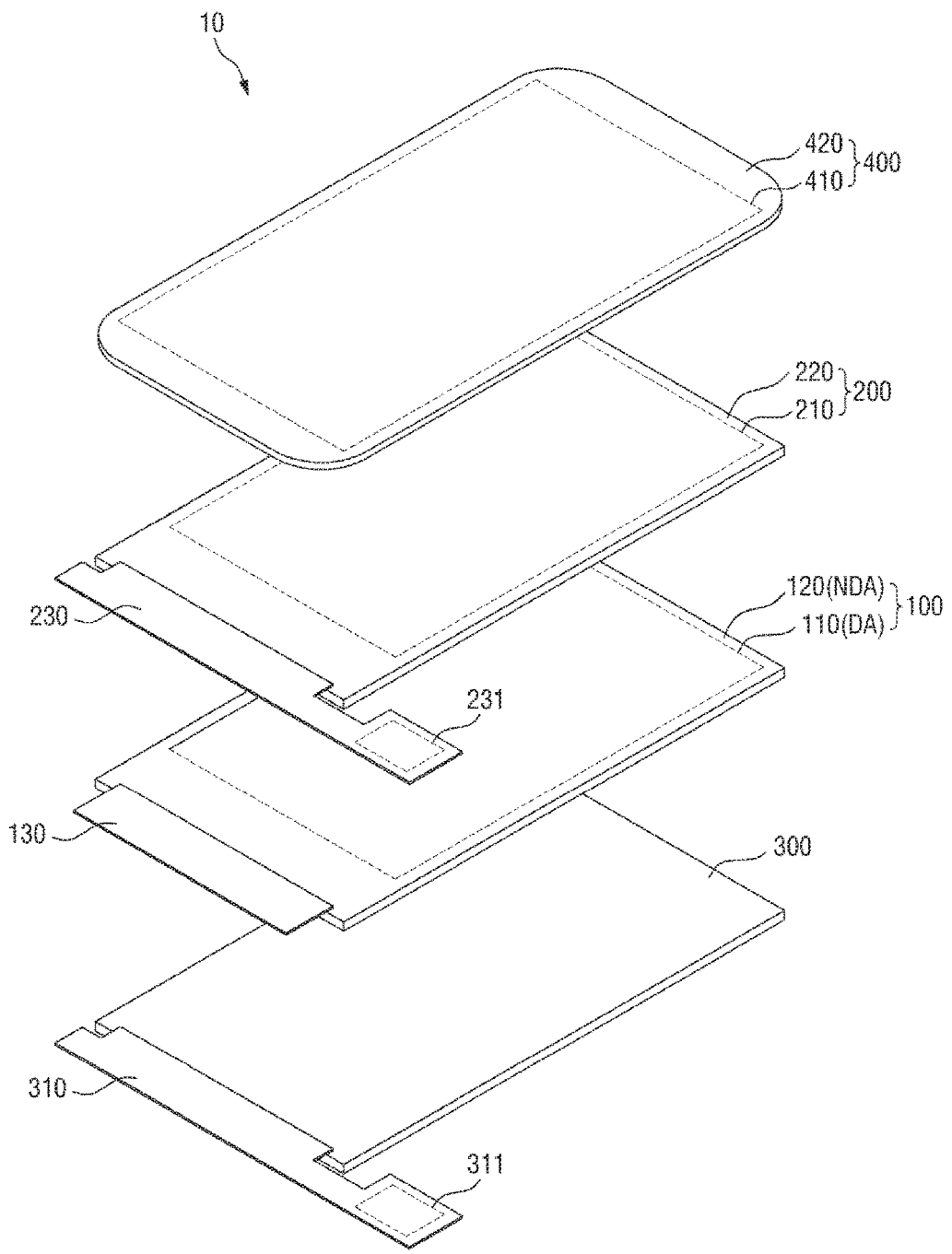
FIG. 1 is a schematic plan view of a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a schematic plan view of a display device according to an exemplary embodiment of the present disclosure. FIG. 2 is a cross-sectional view taken along line I-I' of FIG. 1.

Referring to FIGS. 1 and 2, a display device 10 may include a display panel 100, an input sensing member 200, a pressure sensing member 300, and a window 400.

The display panel 100 displays an image. In one exemplary embodiment, the display panel 100 may be disposed above the pressure sensing member 300. In one exemplary embodiment, the display panel 100 may be disposed below the input sensing member 200. Unless specified otherwise, the terms "above", "on", "top", and "top surface", as used herein, denote a display unit 110's side of the display panel 100, and the terms "below", "beneath", "bottom", and "bottom surface", as used herein, denote the opposite side of the display panel 100 to the display unit 110's side.

In one exemplary embodiment, the display panel 100 may be rectangular in a plan view. The term "rectangular", as used herein, encompasses not only a substantially rectangular shape, but also a shape that is nearly rectangular, in consideration of conditions during processes. The display panel 100 may have long sides and short sides, which are shorter than the long sides. In one exemplary embodiment, the display panel 100 may have a right angle at each of the corners thereof where the long sides and the short sides meet. In another exemplary embodiment, the display panel 100 may be curved at the corners thereof. That is, the planar shape of the display panel 100 is not particularly limited to that illustrated in FIG. 1. That is, the display panel 100 may have a substantially circular shape or another shape.

The display panel 100 may include a display area DA and a non-display area NDA. The display area DA may be defined as an area in which to display an image. The display unit 110 may be disposed on the display area DA. A plurality of pixel units (PX of FIG. 3) for realizing an image may be disposed on the display unit 110.

The non-display area NDA may be disposed on the outside of the display area DA and may be defined as an area in which no image is displayed. In one exemplary embodiment, the non-display area NDA may be disposed to surround the display area DA. FIG. 1 illustrates the non-display area NDA as surrounding the display area DA, but the present disclosure is not limited thereto. In another exemplary embodiment, the non-display area NDA may be disposed adjacent to only one or the other side of the display area DA or may be disposed adjacent to both sides of the display area DA.

A first flexible printed circuit (FPC) 130 may be disposed on the non-display area NDA. The first FPC 130 may be electrically connected to the display unit 110 via a first output pad unit (122 of FIG. 3), which will be described later. Referring to FIG. 1, the first FPC 130 may be folded toward the rear surface of the display panel 100. As a result, the area of the dead space on the outside of the display area DA can be minimized. The electrical connection between the first FPC 130 and the display unit 110 will be described later with reference to FIG. 3.

The input sensing member 200 may be disposed on the display panel 100. The input sensing member 200 may acquire coordinate information from an external input such as, for example, a user's touch. That is, the input sensing member 200 may be a touch panel that senses the user's touch or a fingerprint sensing panel that acquires fingerprint information of the user's finger.

In one exemplary embodiment, the input sensing member 200 may sense an external input in a capacitive manner, but an input sensing method used by the input sensing member 200 is not particularly limited. In another exemplary embodiment, the input sensing member 200 may sense an external input using, for example, an electromagnetic induction method.

Figure 2A:
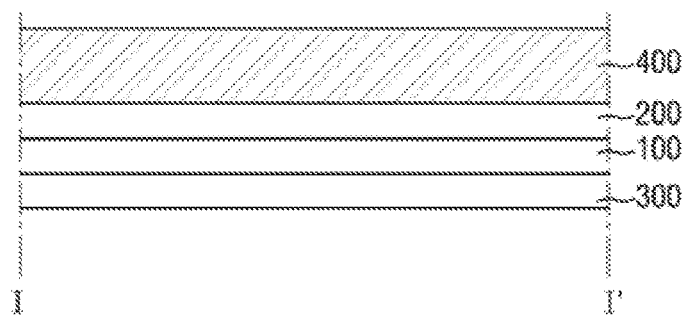
FIGS. 2A and 2B are cross-sectional views taken along line I-I' of FIG. 1.

Referring to FIG. 2(a), in one exemplary embodiment, the input sensing member 200 may be formed on the display panel 100 through a continuous process. That is, the input sensing member 200 may be directly formed above the display panel 100 after the formation of the display panel 100.

Alternatively, referring to FIG. 2(b), the input sensing member 200 may be formed as a separate element and may be coupled later to the display panel 100 using a first adhesive member 510, etc. In a case where the input sensing member 200 is formed as a separate element such as, for example, a separate film, the input sensing member 200 may include a base layer providing a base surface. In one exemplary embodiment, the base layer may include a synthetic resin film, a glass substrate, a composite film, etc. In one exemplary embodiment, the first adhesive member 510 may be a pressure sensitive adhesive (PSA), an optically clear adhesive (OCA), an optically clear resin (OCR), etc.

The input sensing member 200 may overlap with the display panel 100. In one exemplary embodiment, the input sensing member 200 may have substantially the same size as the display panel 100. That is, as illustrated in FIGS. 2(a) and 2(b), the sides of the input sensing member 200 may be aligned with the sides of the display panel 100, but the present disclosure is not limited thereto. That is, alternatively, the input sensing member 200 may overlap with only part of the display panel 100. In one exemplary embodiment, the input sensing member 200 may at least partially overlap with the display area DA.

The input sensing member 200 may include a touch area 210 in which a plurality of touch electrodes are disposed and a peripheral area which is provided on the periphery of the touch area 210 and in which conductive lines electrically connected to the touch electrodes are disposed. A second FPC 230 may be disposed on the peripheral area 220 of the input sensing member 200. The second FPC 230 may be electrically connected to a third output pad unit (221 of FIG. 6), which will be described later. The arrangement of the touch electrodes, the arrangement of the conductive lines, and the electrical connection between the touch electrodes and the conductive lines will be described later with reference to FIGS. 6 and 7. The second FPC 230 may be included in the input sensing member 200.

The second FPC 230 may include a first bonding pad unit 231. In one exemplary embodiment, the first bonding pad unit 231 may be disposed on one side, in a longitudinal direction, of the second FPC 230. The first bonding pad unit 231 may be electrically connected to the third output pad unit (221 of FIG. 6), which is disposed in the input sensing member 200. In one exemplary embodiment, the first bonding pad unit 231 may be electrically connected to a second bonding pad unit 311 of a third FPC 310, which will be described later. The connection between the first and second bonding pad units 231 and 311 will be described later. Referring to FIG. 1, the second FPC 230 may be folded toward the rear surface of the display panel 100.

The pressure sensing member 300 may be disposed below the display panel 100. The pressure sensing member 300 may sense pressure applied from the outside. In one exemplary embodiment, the pressure sensing member 300 may include a plurality of sensing electrodes and may calculate the level of touch pressure applied from the outside based on sensing signals acquired from the sensing electrodes. The pressure sensing member 300 will be described later with reference to FIGS. 8 and 9.

Referring to FIG. 2(a), in one exemplary embodiment, the pressure sensing member 300 may be formed below the display panel 100 through a continuous process. That is, the pressure sensing member 300 may be directly formed below the display panel 100 after the formation of the display panel 100. Alternatively, the pressure sensing member 300 may be formed, and then, the display panel 100 may be formed.

Alternatively, referring to FIG. 2(b), the pressure sensing member 300 may be formed as a separate element and may be coupled later to the display panel 100 using a second adhesive member 520, etc. In a case where the pressure sensing member 300 is formed as a separate element, the pressure sensing member 300 may include a base layer providing a base surface. The base layer of the pressure sensing member 300 may correspond to a base layer 306 of FIG. 9. In one exemplary embodiment, the pressure sensing member 300 may be a PSA, an OCA, an OCR, etc.

The pressure sensing member 300 may overlap with the display panel 100. In one exemplary embodiment, the pressure sensing member 300 may have substantially the same size as the display panel 100. That is, as illustrated in FIGS. 2(a) and 2(b), the sides of the pressure sensing member 300 may be aligned with the sides of at least one of the display panel 100 and the input sensing member 200, but the present disclosure is not limited thereto. That is, alternatively, the pressure sensing member 300 may have a different shape and size from the display panel 100 and the input sensing member 200.

The third FPC 310 may be disposed on the pressure sensing member 300. The third FPC 310 may be electrically connected to a fifth output pad unit (301 of FIG. 8), which will be described later. The third FPC 310 may include the second bonding pad unit 311. In one exemplary embodiment, the second bonding pad unit 311 may be disposed on one side, in a longitudinal direction, of the third FPC 310. The third FPC 310 may be included in the pressure sensing member 300 and may be formed at the same time as the pressure sensing member 300.

In one exemplary embodiment, the second bonding pad unit 311 may be electrically connected to a fifth output pad unit 301, which is disposed in the pressure sensing member 200. The second bonding pad unit 311 may be physically and/or electrically connected to the first bonding pad unit 231. That is, the location of the second bonding pad unit 311 is not particularly limited as long as the second bonding pad unit 311 can be physically and/or electrically connected to the first bonding pad unit 231 with ease. However, in order for the second bonding pad unit 311 to be electrically connected to the first bonding pad unit 231 with ease, the second bonding pad unit 311 may be arranged in the same direction as the first bonding pad unit 231. Referring to FIG. 1, the third FPC 310 may be folded toward the rear surface of the pressure sensing member 300.

The window 400 may be disposed above the input sensing member 200. The window 400 may be disposed above the display panel 100 and may thus protect the display panel 100. Also, the window 400 may transmit light emitted from the display panel 100 therethrough. In one exemplary embodiment, the window 400 may be formed of glass.

The window 400 may include a light-transmitting area 410 and a light-shielding area 420. The light-transmitting area 410 may at least partially overlap with the display area DA of the display panel 100. The light-transmitting area 410 may transmit light emitted from the display panel 100 therethrough to the outside. The light-shielding area 420 may be disposed on the periphery of the light-transmitting area 410 and may at least partially overlap with the non-display area NDA of the display panel 100.

Referring to FIG. 2(a), the window 400 may be disposed directly on the input sensing member 200. Alternatively, referring to FIG. 2(b), the window 400 may be coupled to the input sensing member 200 via a third adhesive member 530. In one exemplary embodiment, the third adhesive member 530 may be an OCA, an OCR, etc.

Figure 2B:
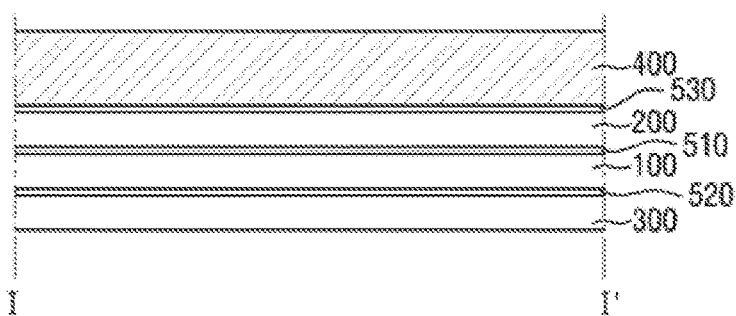

FIG. 2(a) illustrates the display panel 100, the input sensing member 200, the pressure sensing member 300, and the window 400 as being coupled to one another without the aid of any adhesive members, and FIG. 2(b) illustrates the display panel 100, the input sensing member 200, the pressure sensing member 300, and the window 400 as being coupled to one another with the aid of adhesive members. However, the present disclosure is not limited to the examples of FIGS. 2(a) and 2(b). That is, at least one of the display panel 100, the input sensing member 200, the pressure sensing member 300, and the window 400 may be coupled together with or without the aid of adhesive members.

Although not specifically illustrated, an anti-reflection member may be disposed between the window 400 and the input sensing member 200. The anti-reflection member may reduce the reflectance of external light incident thereupon from above the window 400. In one exemplary embodiment, the anti-reflection member may include a retarder and a polarizer.

In one exemplary embodiment, the retarder may be of a film type or a liquid crystal coating type. The retarder may include a $\lambda/2$ retarder and/or a $\lambda/4$ retarder. In one exemplary embodiment, the polarizer may be of a film type or a liquid crystal coating type. The film-type polarizer may include a stretch-type synthetic resin film. The liquid crystal coating-type polarizer may include liquid crystal molecules arranged in a predetermined manner.

The location of the anti-reflection member is not particularly limited. That is, alternatively, the anti-reflection member may be disposed between the input sensing member 200 and the display panel 100. Still alternatively, the anti-reflection member may not be provided, in which case, a color filter and a black matrix may be provided instead of the anti-reflection member.

The display panel 100 will hereinafter be described with reference to FIGS. 3 and 4.

Figure 3:
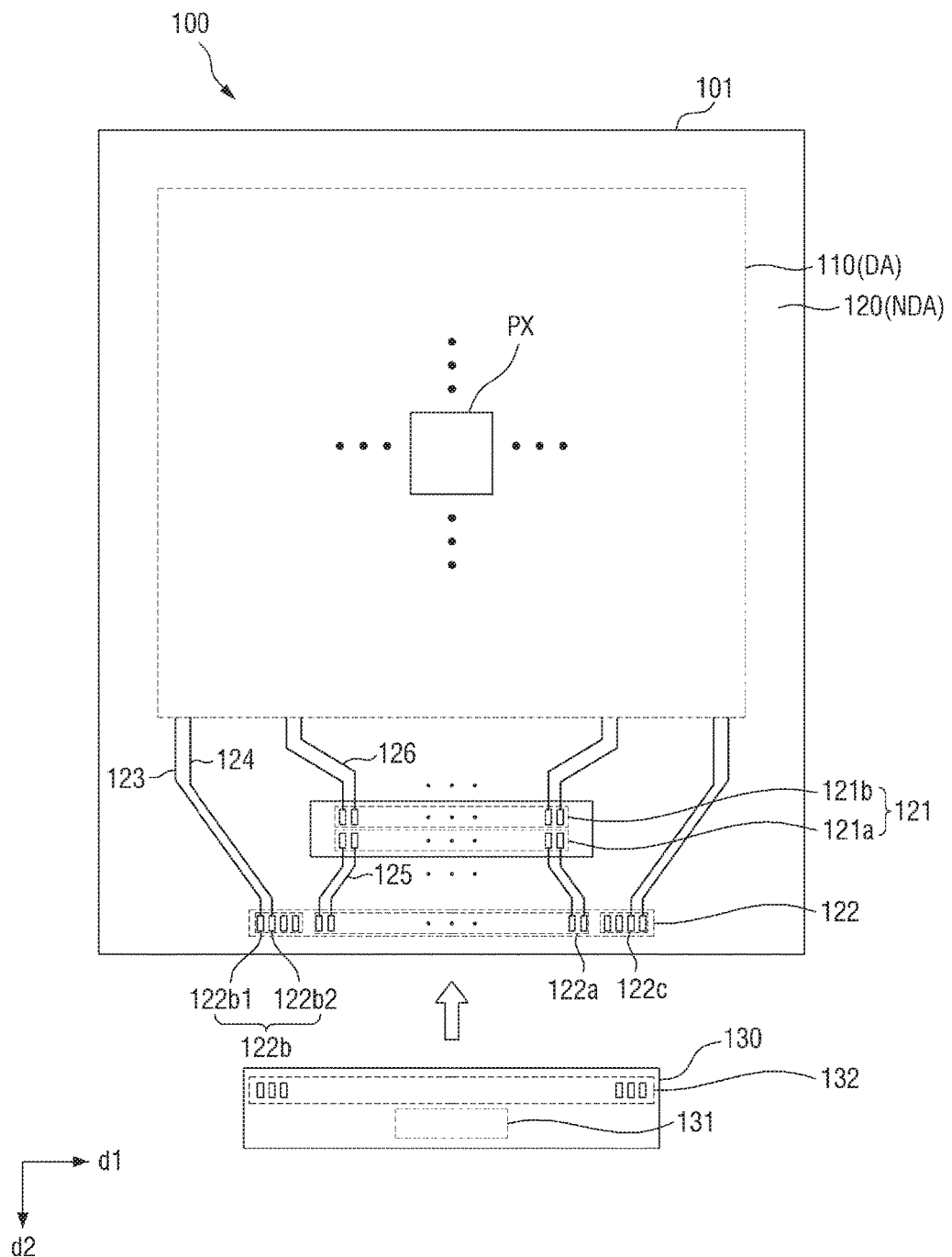
FIG. 3 is a plan view of a display panel of FIG. 1.

FIG. 3 is a plan view of the display panel of FIG. 1. FIG. 4 shows equivalent circuit diagrams of examples of a pixel unit of FIG. 3.

Referring to FIG. 3, the display panel 100 may include a first substrate 101, a display unit 110, a driver integrated circuit (IC) 121, and a first output pad unit 122.

The first substrate 101 may be an insulating substrate. In one exemplary embodiment, the first substrate 101 may comprise a material such as glass, quartz, a polymer resin, etc. The material of the polymer resin may be polyethersulphone (PES), polyacrylate (PA), polyarylate (PAR), polyetherimide (PEI), polyethylene naphthalate (PEN), polyethylene terephthalate (PET), polyphenylenesulfide (PPS), polyallylate, polyimide (PI), polycarbonate (PC), cellulose triacetate (CAT), cellulose acetate propionate (CAP), or a combination thereof.

The first substrate 101 may include the display area DA and the non-display area NDA.

The display unit 110 is disposed on the display area DA. A plurality of pixel units PX for realizing an image are disposed on the display unit 110. The pixel units PX will hereinafter be described with reference to FIG. 4.

Figures 4A, 4B:
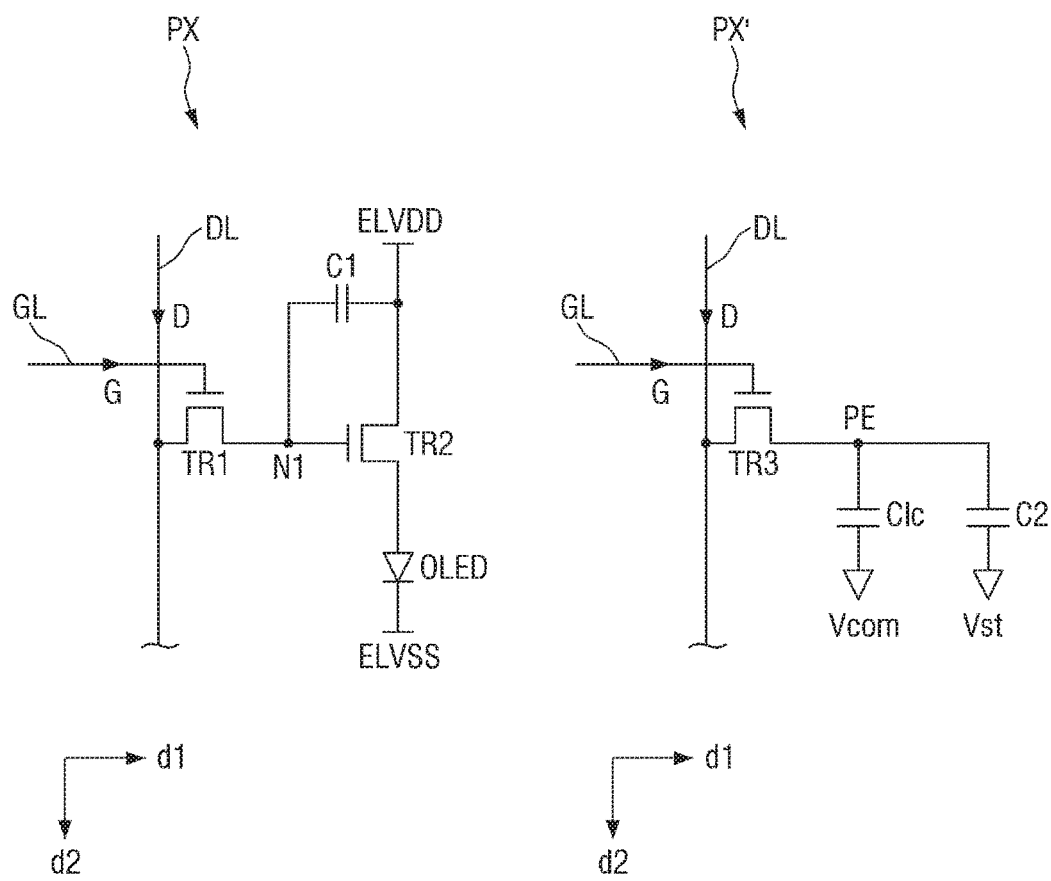
FIGS. 4A and 4B show equivalent circuit diagrams of examples of a pixel unit of FIG. 3.

Referring to FIG. 4(a), a pixel unit PX may include a first switching element TR1, a second switching element TR2, a first storage capacitor C1, and an organic light-emitting diode (OLED) "OLED". That is, in a case where the display panel 100 has the pixel unit PX of FIG. 4(a), the display panel 100 is an organic light-emitting display panel.

The first switching element TR1 may include a control electrode electrically connected to a scan line GL, which extends in a first direction d1, a first electrode electrically connected to a data line DL, which extends in a second direction d2, and a second electrode electrically connected to a first node N1. Accordingly, the first switching element TR1 may provide a data signal D provided thereto via the data line DL to the first node N1 by performing a switching operation in accordance with a scan signal G provided thereto via the scan line GL. That is, the first switching element TR1 may be a switching transistor. In one exemplary embodiment, the first direction d1 may intersect the second direction d2. Referring to FIG. 4, the first direction d1 may be a row direction, and the second direction d2 may be a column direction.

The second switching element TR2 may include a control electrode electrically connected to the first node N1, a first electrode provided with a first driving voltage ELVDD, and a second electrode electrically connected to the OLED "OLED". The first driving voltage ELVDD and a second driving voltage ELVSS may be direct-current (DC) voltages, and the second driving voltage ELVSS may be lower than the first driving voltage ELVDD.

Accordingly, the second switching element TR2 may control a driving current flowing to the OLED "OLED" by performing a switching operation in accordance with the data signal D received from the first switching element TR1. That is, the second switching element TR2 may be a driving transistor.

The first storage capacitor C1 may include a first electrode electrically connected to the first node N1 and a second electrode provided with the first driving voltage ELVDD. The first storage capacitor C1 may be charged with a voltage corresponding to the difference between the voltage provided to the first node N1 and the first driving voltage ELVDD.

The pixel unit PX is not particularly limited to the structure illustrated in FIG. 4(a). That is, alternatively, the pixel unit PX may further include a plurality of switching elements for compensating for the threshold voltage of the second switching element TR2 or for compensating for deterioration of the OLED "OLED".

Referring to FIG. 4(b), a pixel unit PX' may include a third switching element TR3, a pixel electrode PE, a liquid crystal capacitor C1c, and a second storage capacitor C2. That is, in a case where the display panel 100 has the pixel unit PX' of FIG. 4(b), the display panel 100 is a liquid crystal display (LCD) panel.

The third switching element TR3 may be electrically connected to a scan line GL, a data line DL, and the pixel electrode PE. In one exemplary embodiment, the third switching element TR3 may be a three-terminal element such as a thin-film transistor (TFT). The third switching element TR3 may include a control electrode connected to the scan line GL and a first electrode connected to the data line DL. A second electrode of the third switching device TR3 may be connected to the pixel electrode PE.

The third switching element TR3 may be turned on in accordance with a scan signal G provided thereto via the scan line GL and may thus provide a data signal D provided thereto via the data line DL to the pixel electrode PE.

The pixel electrode PE may be capacitively coupled to a common electrode to which a common voltage Vcom is provided. That is, the liquid crystal capacitor C1c may be formed between the pixel electrode PE and the common electrode. The second storage capacitor C2 may include a first electrode electrically connected to the pixel electrode PE and a second electrode electrically connected to a storage electrode, which is provided with a storage voltage Vst.

The pixel unit PX' is not particularly limited to the structure illustrated in FIG. 4(b). That is, alternatively, the pixel unit PX' may further include a plurality of switching elements for improving visibility in addition to the third switching element TR3.

Although not specifically illustrated, the display panel 100 may be a quantum dot display panel, rather than being an organic light-emitting display panel or an LCD panel. The display panel 100 will hereinafter be described as being an organic light-emitting display panel.

Referring again to FIG. 3, the driving IC 121 may be disposed on the non-display area NDA. Specifically, the driving IC 121 may be disposed between the display area DA and the first output pad unit 122. The driving IC 121 may be mounted directly on the first substrate 101. FIG. 3 illustrates an example in which only one driving IC 121 is provided, but the present disclosure is not limited to this example. That is, alternatively, a plurality of driving ICs may be disposed on the non-display area NDA. In one exemplary embodiment, the driving IC 121 may be disposed on the first FPC 130, instead of being disposed directly on the first substrate 101. In another exemplary embodiment, the driving IC 121 may be integrated with a timing controller 131, which is disposed on the first FPC 130.

The driving IC 121 may generate a plurality of scan signals (G of FIG. 4) and/or a plurality of data signals (D of FIG. 4) based on a driving signal provided by the first output pad unit 122 and may provide the plurality of scan signals and/or the plurality of data signals to the pixel units PX. To this end, a plurality of input lines 125, which electrically connect the first output pad unit 122 and the driving IC 121, may be disposed on the first substrate 101. Also, a plurality of output lines 126, which electrically connect the driving IC 121 and the display unit 110, may be disposed on the first substrate 101.

The electrical connection between the driving IC 121 and the input lines 125 and the electrical connection between the driving IC 121 and the output lines 126 are not particularly limited. In one exemplary embodiment, the driving IC 121 may be electrically connected to each of the input lines 125 and each of the output lines 126 via an anisotropic conductive film (ACF). In one exemplary embodiment, the ACF may include an adhesive resin and a plurality of conductive particles scattered in the adhesive resin.

The driving IC 121 may include a plurality of bump portions. Specifically, the bump portions may include an input bump portion 121a and an output bump portion 121b.

The input bump portion 121a includes a plurality of input bumps, which are arranged along the first direction d1 to be a predetermined distance apart from one another. The input bump portion 121a may be electrically connected to the first output unit 122 via the input lines 125. That is, the input bump portion 121a may receive a driving signal from the first output pad unit 122 via the input lines 125.

The output bump portion 121b may include a plurality of output bumps, which are arranged along the first direction d1 to be a predetermined distance apart from one another. The output bump portion 121b may be a predetermined distance apart from the input bump portion 121a along the second direction d2. The output bump portion 121b may be electrically connected to the display unit 110 via the output lines 126. That is, the output bump portion 121b may provide the plurality of scan signals and/or the plurality of data signals to the display unit 110 via the output lines 126.

Although not specifically illustrated, the driving IC 121 may further include an inspecting bump portion in addition to the input and output bump portions 121a and 121b, and the inspecting bump portion determines whether the output of the driving IC 121 is normal and/or whether the pixel units PX are turned on or off normally.

In one exemplary embodiment, the first output pad unit 122 may be disposed to extend along the sides of the first substrate 101 along the first direction d1. The first output pad unit 122 may be electrically connected to the first FPC 130. In one exemplary embodiment, the first output pad unit 122 may include a signal applying pad portion 122a and driving voltage pad portions 122b and 122c.

The signal applying pad portion 122a may include a plurality of pads receiving a driving signal for controlling the driving IC 121 from the first FPC 130. The signal applying pad portion 122a may be electrically connected to the input lines 125.

The driving voltage pad portions 122b and 122c may be disposed on both sides of the signal applying pad portion 122a. The driving voltage pad portion 122b will hereinafter be described.

In one exemplary embodiment, the driving voltage pad portion 122b may include a first driving voltage pad 122b1 electrically connected to a first driving voltage line 123 and a second driving voltage pad 122b2 electrically connected to a second driving voltage line 124.

In a case where the pixel units PX have the same structure as the pixel PX of FIG. 4(a) (i.e., in a case where the display panel 100 is an organic light-emitting display panel), the first driving voltage line 123 may be defined as a line receiving the first driving voltage ELVDD of FIG. 4(a), and the second driving voltage line 124 may be defined as a line receiving the second driving voltage ELVSS of FIG. 4(a).

The first output pad unit 122 may provide the first and second driving voltages ELVDD and ELVSS directly to the display unit 110 via the first and second driving voltage lines 123 and 124, respectively. That is, the first and second driving voltage lines 123 and 124 may be bypass lines.

On the other hand, in a case where the pixel units PX have the same structure as the pixel PX' of FIG. 4(b) (i.e., in a case where the display panel 100 is an LCD panel), the first driving voltage line 123 may be defined as a line receiving the common voltage Vcom of FIG. 4(b), and the second driving voltage line 124 may be defined as a line receiving the storage voltage Vst of FIG. 4(b). Alternatively, in a case where the display panel 100 is an LCD panel, the second driving voltage line 124 may not be provided.

The arrangement of the first and second driving voltage lines 123 and 124 is not particularly limited to that illustrated in FIG. 3. That is, alternatively, at least one of the first and second driving voltage lines 123 and 124 may be disposed to at least partially surround the display area DA.

The timing controller 131 and the second output pad unit 132 may be disposed on the first FPC 130. The timing controller 131 may provide a driving signal for controlling the operation of the display panel 100 to the first output pad unit 122. To this end, the second output pad unit 132 may be electrically connected via a different signal line from the first output pad unit 122. In one exemplary embodiment, the timing controller 131 may be mounted on the first FPC 130 as an IC.

In a case where the display panel 100 is an organic light-emitting display panel, an encapsulation member, which covers OLEDs, may be disposed on the first substrate 101. The encapsulation member may block the OLEDs from external oxygen and moisture.

In one exemplary embodiment, the encapsulation member may be a transparent insulating substrate. That is, the encapsulation member may be a glass substrate, a quartz substrate, a transparent resin substrate, etc. In a case where the encapsulation member is a transparent insulating substrate, a sealing member for bonding may be formed between the encapsulation member and the first substrate 101.

In one exemplary embodiment, the encapsulation member may have a single- or multilayer structure in which at least one of an organic layer and an inorganic layer is stacked. The organic layer may comprise at least one selected from the group consisting of epoxy, acrylate, and urethane acrylate. The inorganic layer may comprise at least one selected from the group consisting of silicon oxide (SiOx), silicon nitride (SiNx), and silicon oxynitride (SiONx). In another exemplary embodiment, the organic layer may be replaced by a hexamethyldisiloxane (HMDSO) layer. The HMDSO layer can absorb stress. Accordingly, the encapsulation member may have sufficient flexibility. After the formation of the inorganic layer, the HMDSO layer may be formed through a continuous process in the same chamber used to form the inorganic layer.

In a case where the encapsulation member has a single- or multilayer structure in which at least one of the organic layer and the inorganic layer is stacked, the first substrate 101 may further include a bending area overlapping with the non-display area NDA. The bending area will hereinafter be described with reference to FIG. 5.

Figure 5:
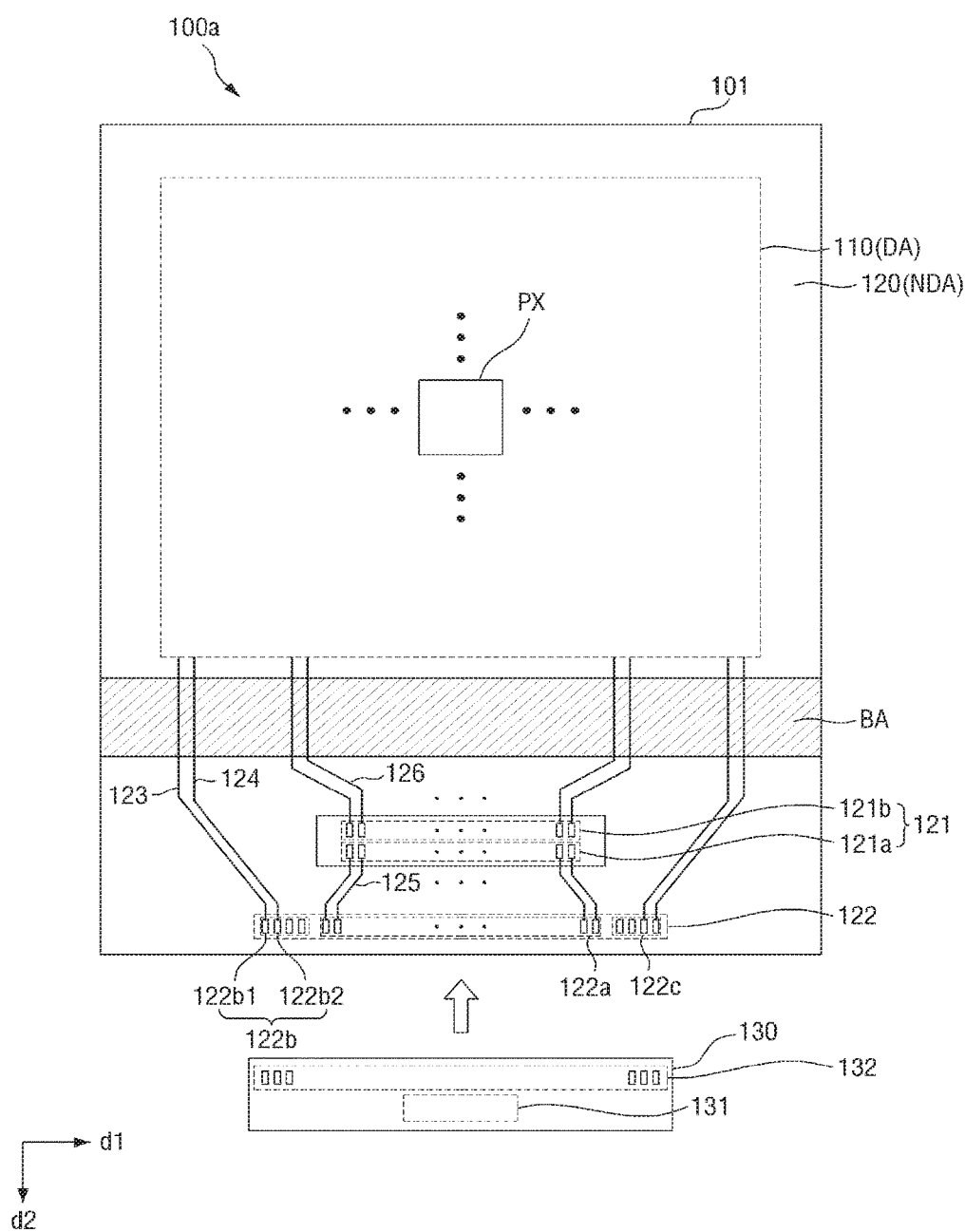
FIG. 5 is a plan view of a display panel having a bending area.

FIG. 5 is a plan view of a display panel having a bending area.

Referring to FIG. 5, a display panel 100a may include a first substrate 101 in which a bending area BA is provided. The bending area BA may overlap with a non-display area NDA. The bending area BA may be defined as an area that is bent along an imaginary bending axis disposed in the bending area BA. Accordingly, the first substrate 101 may be a flexible substrate. In one exemplary embodiment, the first substrate 101 may be a flexible substrate comprising PI. In one exemplary embodiment, the bending area BA may be disposed between a display unit 110 and a driving IC 121. Since the bending area BA is provided, dead space on the outside of the display unit 110 can be minimized. In a case where the first substrate 101 includes the bending area BA, a first FPC 130 may not be provided or may be replaced with a printed circuit board (PCB).

An example of the input sensing member 200 will hereinafter be described with reference to FIGS. 6 and 7.

Figure 6:
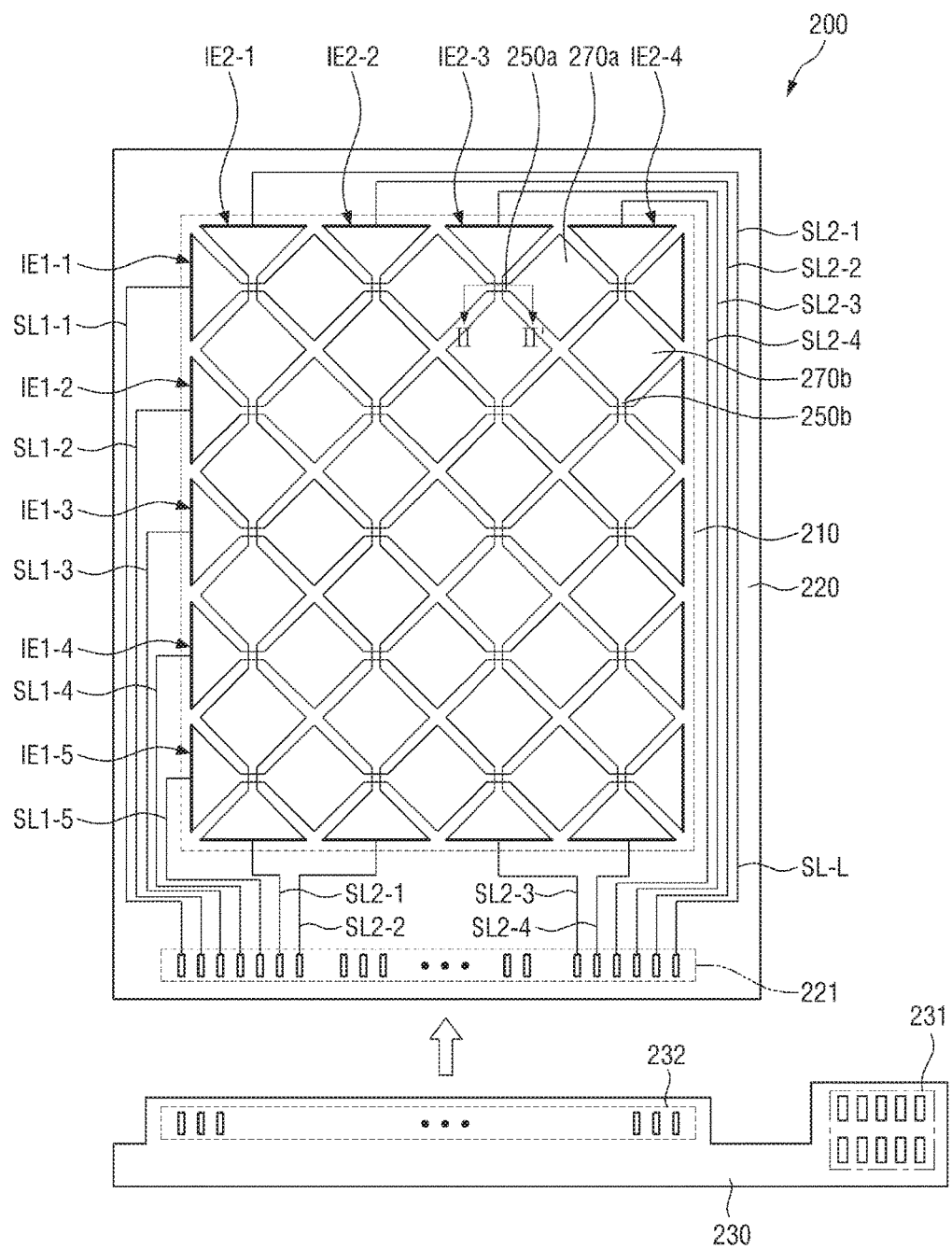
FIG. 6 is a plan view of an example of an input sensing member of FIG. 1.

FIG. 6 is a plan view of an example of the input sensing member of FIG. 1. FIG. 7 shows cross-sectional views taken along line II-II' of FIG. 6.

Referring to FIG. 6, the input sensing member 200 may include a plurality of first sensing electrodes IE1-1 through IE1-5, a plurality of first signal lines SL1-1 through SL1-5, a plurality of second sensing electrodes IE2-1 through IE2-4, and a plurality of second signal lines SL2-1 through SL2-4.

The first sensing electrodes IE1-1 through IE1-5 and the second sensing electrodes IE2-1 through IE2-4 may be disposed on a touch area 210. The first signal lines SL1-1 through SL1-5 and the second signal lines SL2-1 through SL2-4 may be disposed on a peripheral area 220. In one exemplary embodiment, the peripheral area 220 may be disposed on the outside of the touch area 210 to surround the touch area 210. The touch area 210 may be defined as an area corresponding to the display area DA of the display panel 100. The peripheral area 220 may be defined as an area corresponding to the non-display area NDA of the display panel 100.

The stack structures and the materials of the first sensing electrodes IE1-1 through IE1-5 and the second sensing electrodes IE2-1 through IE2-4 may be determined in consideration of sensing sensitivity. Sensing sensitivity may be affected by resistive-capacitive (RC) delays.

For example, a plurality of sensing electrodes including a metal layer may have a lower resistance than a transparent conductive layer and may thus have a relatively low RC value. Accordingly, the amount of time that it takes to charge capacitors defined between the plurality of sensing electrodes including a metal layer can be reduced. A plurality of sensing electrodes including a transparent conductive layer are relatively invisible to the user, compared to the plurality of sensing electrodes including a metal layer, and can widen an input area so as to increase capacitance. In one exemplary embodiment, the plurality of sensing electrodes including a metal layer may have a mesh shape in order not to be visible to the user.

The first sensing electrodes IE1-1 through IE1-5 and the second sensing electrodes IE2-1 through IE2-4 may intersect each other. In one exemplary embodiment, the first sensing electrodes IE1-1 through IE1-5 and the second sensing electrodes IE2-1 through IE2-4 may sense an external input in a mutual cap manner and/or a self-cap manner. In another exemplary embodiment, the first sensing electrodes IE1-1 through IE1-5 and the second sensing electrodes IE2-1 through IE2-4 may calculate the coordinates of an external input in the mutual cap manner during a first period and may recalculate the coordinates of the external input in the self-cap manner during a second period.

Each of the first sensing electrodes IE1-1 through IE1-5 may include a plurality of first connectors 250a and a plurality of first sensors 270a. Each of the second sensing electrodes IE2-1 through IE2-4 may include a plurality of second connectors 250b and a plurality of second sensors 270b.

In one exemplary embodiment, the first sensing electrodes IE1-1 through IE1-5 and the second sensing electrodes IE2-1 through IE2-4 may be rhombic. The term "rhombic", as used herein, encompasses not only a substantially rhombic shape, but also a shape that is nearly rhombic, in consideration of conditions during processes. However, the first sensing electrodes IE1-1 through IE1-5 and the second sensing electrodes IE2-1 through IE2-4 are not particularly limited to being rhombic. In another exemplary embodiment, the first sensing electrodes IE1-1 through IE1-5 and the second sensing electrodes IE2-1 through IE2-4 may be polygonal or may have a shape such as a bar shape where there is no distinction between sensors and connectors.

The first connectors 250a may connect the first sensors 270a to one another. The second connectors 250b may connect the second sensors 270b to one another.

In one exemplary embodiment, the first signal lines SL1-1 through SL1-5 may be connected to only first ends of the first sensing electrodes IE1-1 through IE1-5, respectively. In another exemplary embodiment, the first signal lines SL1-1 through SL1-5 may be connected to both the first ends and second ends of the first sensing electrodes IE1-1 through IE1-5, respectively.

In one exemplary embodiment, the second signal lines SL2-1 through SL2-4 may be connected to both first ends and second ends of the second sensing electrodes IE2-1 through IE2-4, respectively. Since the input sensing member 200 provides a detection signal (or a transmission signal) via the second signal lines SL2-1 through SL2-4, which are connected to both the first ends and the second ends of the second sensing electrodes IE2-1 through IE2-4, respectively, the input sensing member 200 can prevent a voltage drop in the detection signal (or in the transmission signal) and can thus prevent a decrease in sensing sensitivity. In another exemplary embodiment, the second signal lines SL2-1 through SL2-4 may be connected to only the first ends of the second sensing electrodes IE2-1 through IE2-4, respectively.

The first signal lines SL1-1 through SL1-5 and the second signal lines SL2-1 through SL2-4 may include line portions SL-L and the third output pad unit 221 having a plurality of pads. The first signal lines SL1-1 through SL1-5 and the second signal lines SL2-1 through SL2-4 may be replaced by circuit boards fabricated separately and then coupled.

The third output pad unit 221 may be electrically connected to the second FPC 230. Specifically, the first bonding pad unit 231 and a fourth output pad unit 232 may be disposed on the second FPC 230. The fourth output pad unit 232 may be electrically connected to the third output pad portion 221. In a case where the third and fourth output pad units 221 and 232 are electrically connected to each other, the arrangement of the third and fourth output pad units 221 and 232 is not particularly limited to that illustrated in FIG. 5.

The first bonding pad unit 231 may be disposed on one side, in a longitudinal direction, of the second FPC 230. The first bonding pad unit 231 may be electrically connected to the second bonding pad unit 311, which will be described later. The first bonding pad unit 231 may include a plurality of first pads, and the second bonding pad unit 311 may include a plurality of second pads. The number and the locations of first pads included in the first bonding pad unit 231 and the number and the locations of second pads included in the second bonding pad unit 311 are not particularly limited. The number and the locations of first pads included in the first bonding pad unit 231 may not necessarily be the same as the number and the locations of second pads included in the second bonding pad unit 311, and this will be described later.

Although not specifically illustrated, an input sensing controller, which controls the driving of the input sensing member 200, may be further disposed on the second FPC 230. In one exemplary embodiment, the input sensing controller may be mounted on the second FPC 230 as an IC. In another exemplary embodiment, the input sensing controller may be integrated with the timing controller 131 and may then be mounted on the first FPC 130 as a single IC. In still another exemplary embodiment, the input sensing controller may be mounted on the first FPC 130 as a chip independent of the timing controller 131.

The stack structure of the input sensing member 200 will hereinafter be described with reference to FIG. 7. The input sensing member 200 will hereinafter be described as being formed on the display panel 100 through a continuous process, as described above with reference to FIG. 2(*a*). The stack structure of the input sensing member 200 will hereinafter be described with reference to FIG. 7, taking a first connector 250*a* or 250*a*', a plurality of first sensors 270*a* or 270*a*', a plurality of second sensors 270*b* or 270*b*', and a plurality of second connectors 250*b* or 250*b*', among other elements of the input sensing member 200 of FIG. 6.

Figure 7A:
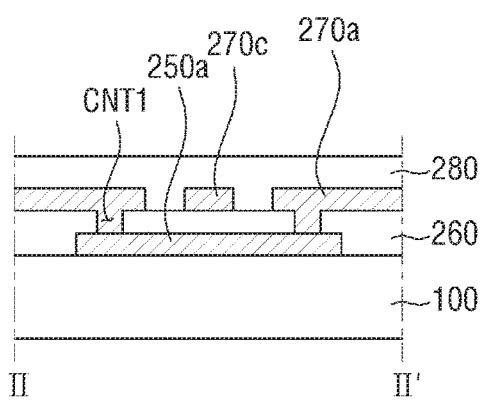
FIGS. 7A and 7B show cross-sectional views taken along line II-II' of FIG. 6.
Figure 7B:
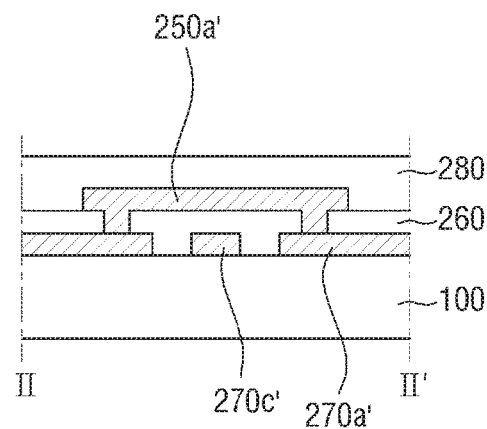

Referring to FIG. 7(*a*), the first connectors 250*a* may be disposed on the display panel 100. Although not specifically illustrated, a buffer layer may be additionally disposed between the display panel 100 and the first connectors 250*a*.

A first insulating layer 260 may be disposed on the first connectors 250*a*. The first insulating layer 260 may be formed to cover the first connectors 250*a*. A plurality of first contact holes CNT1 may be formed in the first insulating layer 260 to at least partially expose the first connectors 250*a*.

The first sensors 270*a*, the second sensors 270*b*, and the second connectors 250*b* may be disposed on the first insulating layer 260. The first sensors 270*a* may be electrically connected to the first connectors 250*a* via the first contact holes CNT1. In one exemplary embodiment, the first connectors 250*a* may comprise a material having a lower resistance than the first sensors 270*a*.

The first connectors 250*a* may intersect the second connectors 250*b*. By minimizing the width of the first connectors 250*a* (as measured on a plane), the influence of parasitic capacitance can be reduced. The first connectors 250*a* may comprise a low-resistance material to improve sensing sensitivity.

A second insulating layer 280 may be disposed on the first sensors 270*a*, the second sensors 270*b*, and the second connectors 250*b*. In one exemplary embodiment, the second insulating layer 280 may comprise the same material as the first insulating layer 260. For example, the first and second insulating layers 260 and 280 may be polymer layers such as acrylic polymer layers. As a result, even if the input sensing member 200 is disposed on the display panel 100, the flexibility of the display device 10 can be improved.

On the other hand, referring to FIG. 7(*b*), the first connectors 250*a*' may be disposed on the first sensors 270*a*' and the second connectors 250*b*'. That is, the input sensing member of FIG. 7(*b*) differs from the input sensing member of FIG. 7(*a*) in that the first connectors 250' are stacked on the first sensors 270*a*' and the second connectors 250*b*', rather than vice versa.

In another exemplary embodiment, the first sensors 270*a* and the second sensors 270*b* may be formed to have a mesh shape and may comprise a metal. As a result, the flexibility of the display device 10 can be improved. In this exemplary embodiment, the first sensors 270*a* and the second sensors 270*b* may be referred to as metal mesh patterns.

The pressure sensing member 300 will hereinafter be described with reference to FIGS. 8 and 9.

Figure 8:
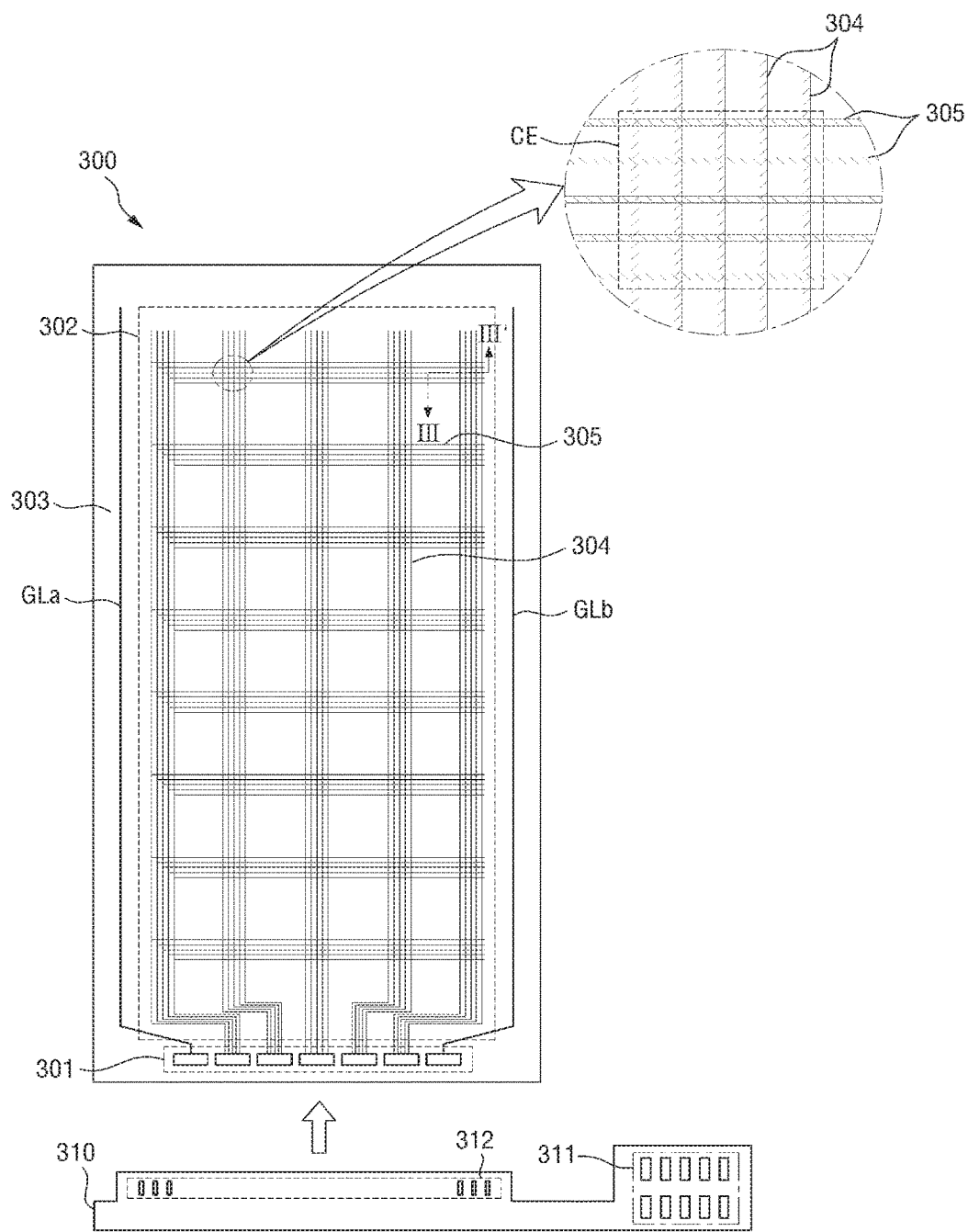
FIG. 8 is a plan view of an example of a pressure sensing member of FIG. 1.

FIG. 8 is a plan view of an example of the pressure sensing member of FIG. 1. FIG. 9 is a cross-sectional view taken along line of FIG. 8.

Figure 9:
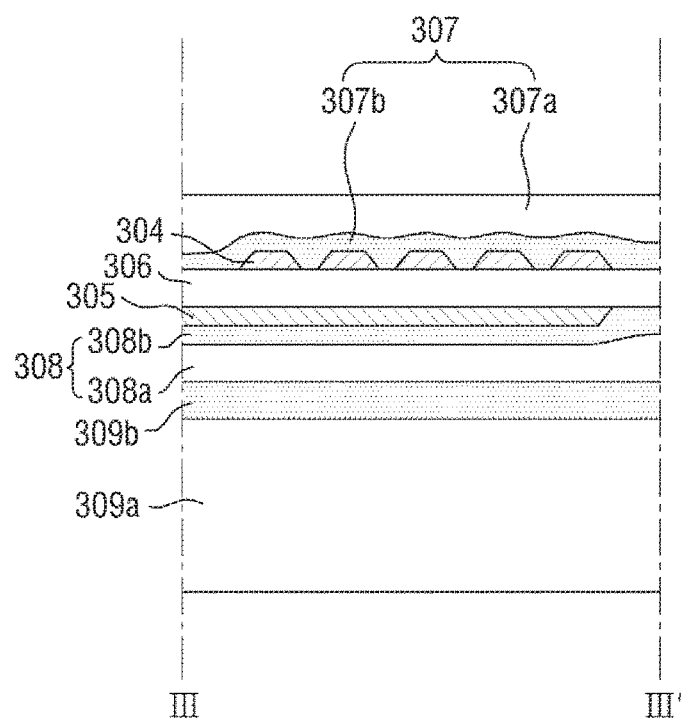
FIG. 9 is a cross-sectional view taken along line III-III' of FIG. 8.

Referring to FIGS. 8 and 9, the pressure sensing member 300 may include the fifth output pad unit 301, first pressure sensing lines 304, and second pressure sensing lines 305.

The fifth output pad unit 301 may be electrically connected to the first pressure sensing lines 304 and the second pressure sensing lines 305. The fifth output pad unit 301 may also be electrically connected to the third FPC 310.

Specifically, the second bonding pad unit 311 and a sixth output pad unit 312 may be disposed on the third FPC 310. The sixth output pad unit 312 may be electrically connected to the fifth output pad portion 301. In a case where the fifth and sixth output pad units 301 and 312 are electrically connected to each other, the arrangement of the fifth and sixth output pad units 301 and 312 is not particularly limited to that illustrated in FIG. 7.

The second bonding pad unit 311 may be disposed on one side, in a longitudinal direction, of the third FPC 310. As described above, the first and second bonding pad units 231 and 311 may be electrically connected to each other, and this will be described later.

Although not specifically illustrated, a pressure sensing controller, which controls the driving of the pressure sensing member 300, may further be disposed on the third FPC 310. In one exemplary embodiment, the pressure sensing controller may be mounted on the third FPC 310 as an IC. In another exemplary embodiment, the pressure sensing controller may be integrated with the timing controller 131 and may then be mounted on the first FPC 130 as a single IC. In another exemplary embodiment, the pressure sensing controller may be mounted on the first FPC 130 as a chip independent of the timing controller 131.

The first pressure sensing lines 304 and the second pressure sensing lines 305 may be disposed on a pressure sensing area 302. First and second ground wires GLa and GLb may be disposed on the peripheral area 303. In one exemplary embodiment, the peripheral area 303 may be disposed on the outside of the pressure sensing area 302 to surround the pressure sensing area 302, and this will hereinafter be described in detail with reference to FIG. 9.

Referring to FIG. 9, the pressure sensing member 300 may include the base layer 306, the first pressure sensing lines 304, and the second pressure sensing lines 305. The first pressure sensing lines 304 may be disposed above the base layer 306, and the second pressure sensing lines 305 may be disposed below the base layer 306.

The pressure sensing member 300 may further include a first coverlay 307, which covers the first pressure sensing lines 304 from above, and a second coverlay 308, which covers the second pressure sensing lines 305 from below. The pressure sensing member 300 may further include a signal shielding sheet 309*a*, which is disposed below the second coverlay 308, and an interlayer bonding layer 309*b*, which is interposed between the signal shielding sheet 309*a* and the second coverlay 308.

The base layer 306 may provide a space in which to form the first pressure sensing lines 304 and the second pressure sensing lines 305. The base layer 306 may be formed of an insulating material. In one exemplary embodiment, the base layer 306 may comprise an inorganic material such as glass, but may comprise an organic material to realize flexibility. For example, the base layer 306 may comprise at least one of PI, PET, PC, PE, PP, PSF, PMMA, TAC, and a COP.

The first pressure sensing lines 304 and the second pressure sensing lines 305 may be disposed on the top surface and the bottom surface, respectively, of the base layer 306. The first pressure sensing lines 304 and the second pressure sensing lines 305 may be formed directly on the surfaces of the base layer 306. In one exemplary embodiment, the first pressure sensing lines 304 and the second pressure sensing lines 305 may comprise a metal material such as copper (Cu), silver (Ag), nickel (Ni), tungsten (W), etc.

FIG. 9 illustrates the first pressure sensing lines 304 and the second pressure sensing lines 305 as being formed as single films, but alternatively, the first pressure sensing lines 304 and the second pressure sensing lines 305 may be formed as stacks of a plurality of films.

Although not specifically illustrated in FIG. 9, the first ground wire GLa may be disposed above the base layer 306, and the second ground wire GLb may be disposed below the base layer 306. In one exemplary embodiment, slits may be formed on the first and second ground wires GLa and GLb. As a result, flexibility can be secured in the slits where no wires are disposed, and the probability of patterns appearing visible from the outside can be reduced.

The first pressure sensing lines 304 may extend in the second direction d2. The second pressure sensing lines 305 may extend in the first direction d1. In one exemplary embodiment, the first pressure sensing lines 304 and the second pressure sensing lines 305 may intersect each other.

The first pressure sensing lines 304 may gather together to form wiring pattern groups, and the second pressure sensing lines 305 may gather together to form wiring pattern groups. For example, as illustrated in FIG. 7, five first or second pressure sensing lines 304 or 305 may gather together to form a single wiring pattern group, but the present disclosure is not limited thereto. That is, various numbers of first or second pressure sensing lines may gather together to form various numbers of wiring pattern groups.

The distance between wiring pattern groups may be greater than the distance between the first pressure sensing lines 304 or the second pressure sensing lines 305 included in each of the wiring pattern groups. The intersections between the wiring pattern groups formed by the first pressure sensing lines 304 and the wiring pattern groups formed by the second pressure sensing lines 305 may become coordinate electrodes CE, which are the basic units for position recognition.

In one exemplary embodiment, the first and second coverlays 307 and 308 may be formed of an insulating material. The first coverlay 307 may protect the first pressure sensing lines 304, and the second coverlay 308 may protect the second pressure sensing lines 305. The first and second coverlays 307 and 308 may be formed as single films or may be formed as stacks of a plurality of films.

For example, the first coverlay 307 may include a first coverlay insulating layer 307a and a first coverlay bonding layer 307b, which are stacked in an upward direction, and the second coverlay 308 may include a second coverlay insulating layer 308a and a second coverlay bonding layer 308b, which are stacked in a downward direction.

The first and second coverlay insulating layers 307a and 308a may comprise at least one of PI, PET, PC, PE, PP, PSF, PMMA, TAC, and a COP.

The first and second coverlay bonding layers 307b and 308b may include adhesive layers or resin layers. The first and second coverlay bonding layers 307b and 308b may not be provided.

The signal shielding sheet 309a is disposed below the first pressure sensing lines 304 and the second pressure sensing lines 305 and blocks signal interference from the outside. The signal shielding sheet 309a may be formed of a ferromagnetic material comprising iron oxide such as, for example, ferrite.

The bonding of the first and second bonding pad units 231 and 311 will hereinafter be described, taking the second and third FPCs 230 and 310.

The bonding of the first and second bonding pad units 231 and 311 may involve a first step, which is a step before the bending of the second and third FPCs 230 and 310, a second step, which is a step after the bending of the second and third FPCs 230 and 310, a third step of bonding the first and second bonding pad units 231 and 311, and a fourth step of folding the first and second bonding pad units 231 and 311 that are bonded. The first through fourth steps are merely exemplary and thus should not be construed as limiting.

The first step will hereinafter be described with reference to FIGS. 10 through 14.

Figure 10:
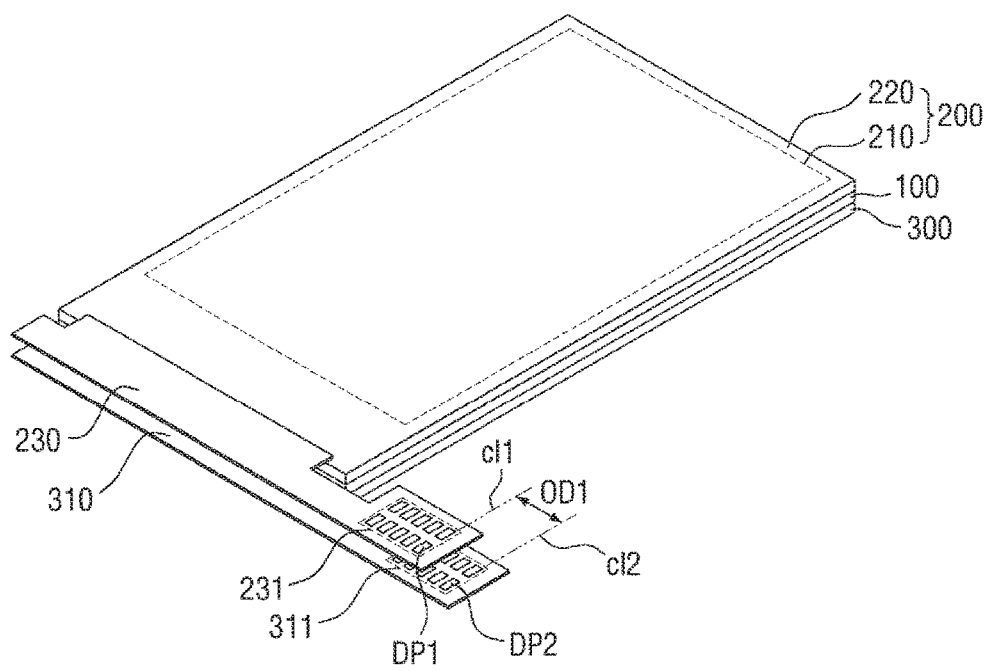
FIG. 10 is a perspective view of the display device according to the exemplary embodiment of FIG. 1 with first and second bonding pad units yet to be bonded.
Figure 11A:
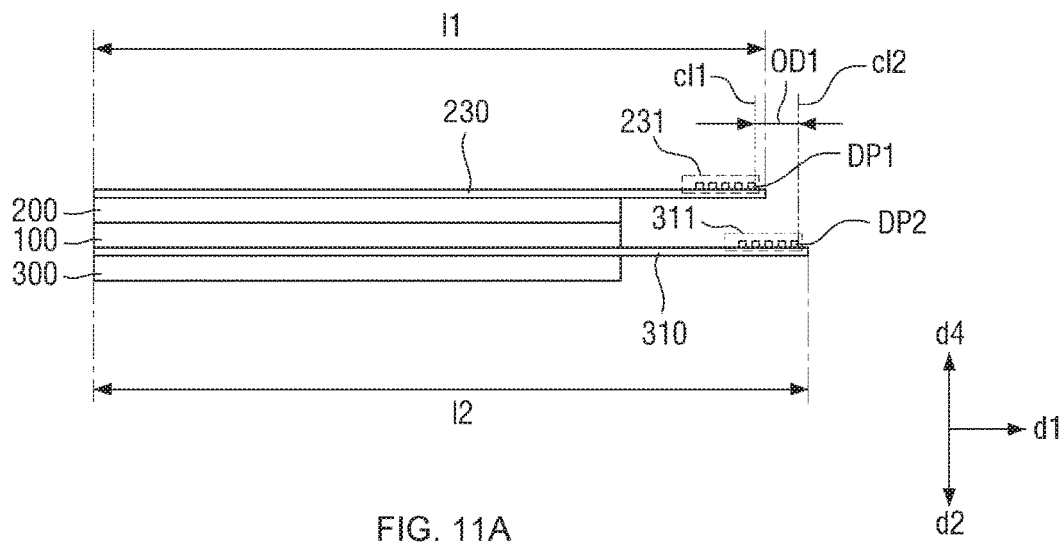
FIGS. 11A, 11B, 12A, 12B, 13A, 13B, 14A, and 14B are views explaining a first offset distance.
Figure 11B:
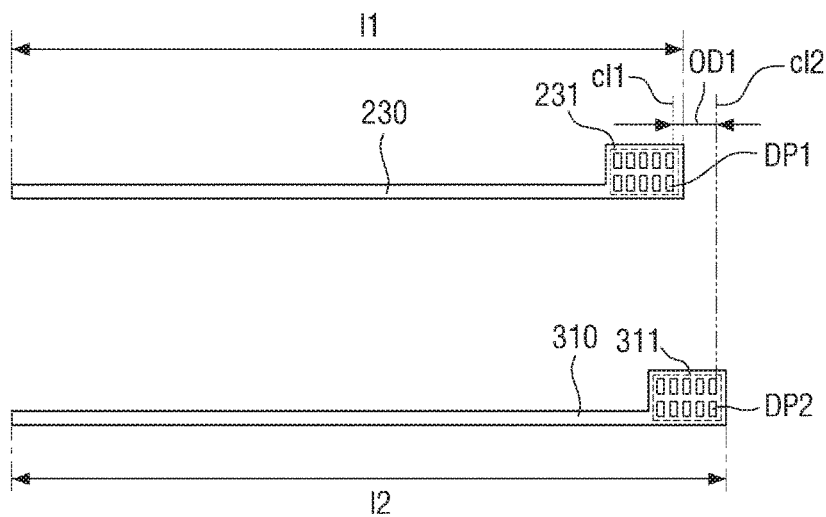
Figure 12A:
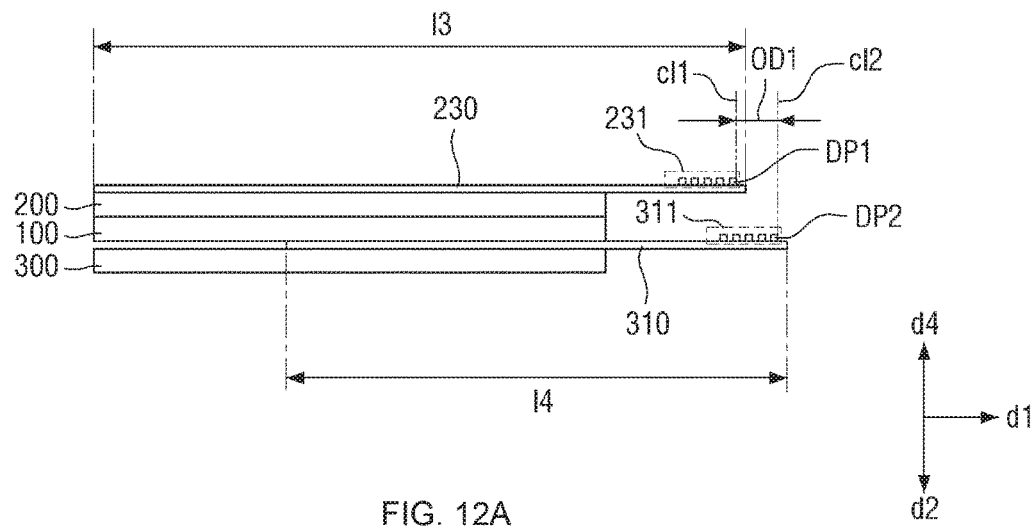
Figure 12B:
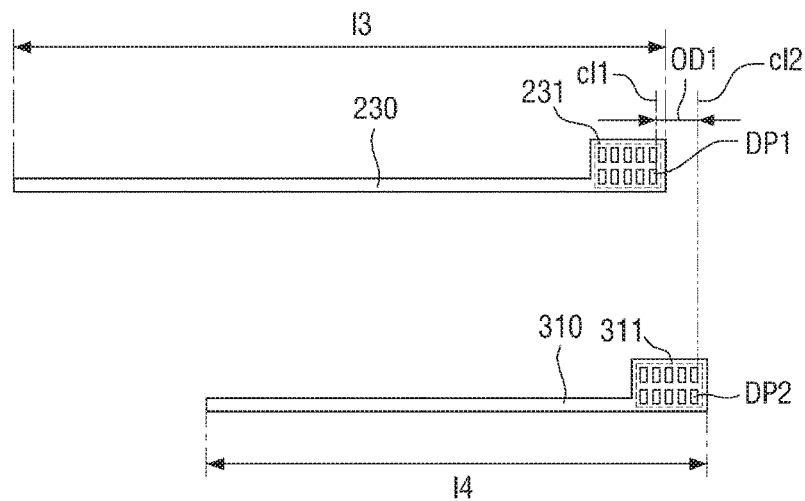
Figure 13A:
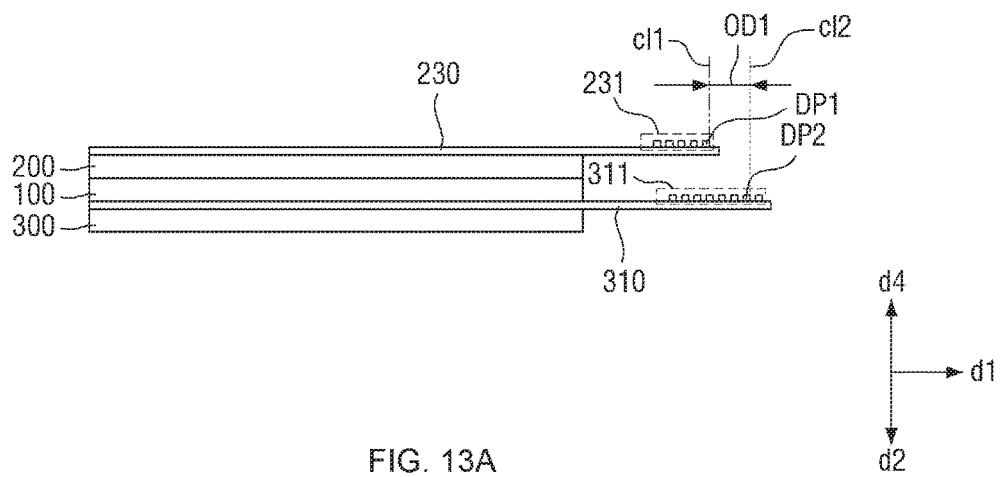
Figure 13B:
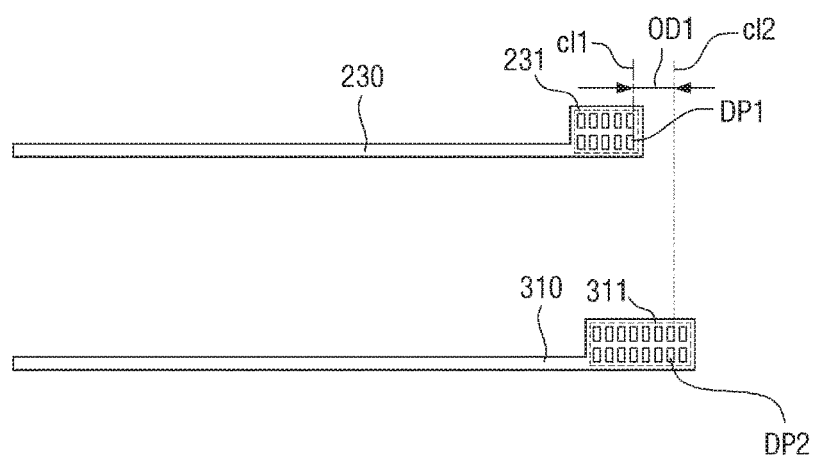
Figure 14A:
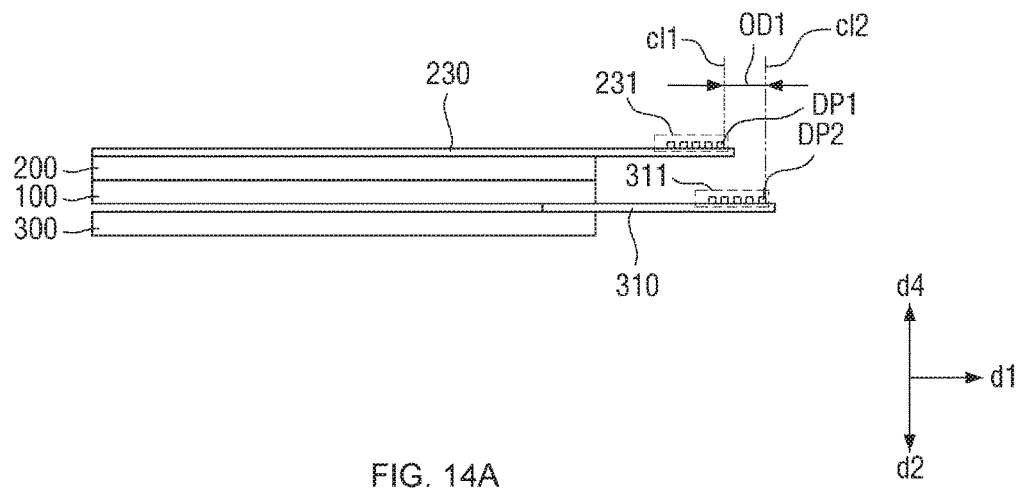
Figure 14B:
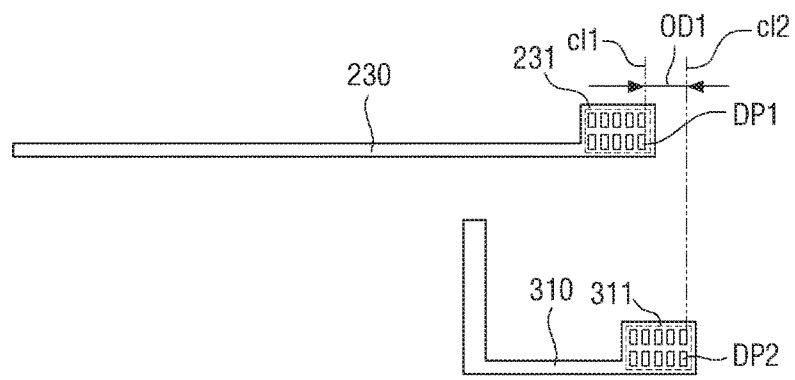

FIG. 10 is a perspective view of the display device according to the exemplary embodiment of FIG. 1 with the first and second bonding pad units yet to be bonded. FIGS. 11 through 14 are views explaining a first offset distance. For convenience, the window 400 and the first FPC 130, which is connected to the first output pad unit (122 of FIG. 3) of the display panel 100, are omitted from FIGS. 10 through 14.

Referring to FIG. 10, the input sensing member 200 may be disposed above the display panel 100, and the pressure sensing member 300 may be disposed below the display panel 100.

The second FPC 340 may be electrically connected to the third output pad unit (221 of FIG. 6) of the input sensing member 200. The third FPC 310 may be electrically connected to the fifth output pad unit (301 of FIG. 8) of the pressure sensing member 300.

The second and third FPCs 230 and 310 at least partially overlap with each other before the bending of the first and second bonding pad units 231 and 311, and are formed so that first offset distance OD1 is not zero.

Specifically, the second and third FPCs 230 and 310 at least partially overlap with each other. The overlapping area of the first and second FPCs 230 and 310 may include the overlapping area of the first and second bonding pad units 231 and 311. The first and second bonding pad units 231 and 311 may extend in the same direction to overlap with each other.

More specifically, the first bonding pad unit 231 may at least partially overlap with the second bonding pad unit 311. As described above, the first bonding pad unit 231 may be physically and/or electrically connected to the second bonding pad unit 311. The location of the overlapping area of the second and third FPCs 230 and 310 and the shapes and the locations of the second and third FPCs 230 and 310 are not particularly limited to those illustrated in FIG. 10 as long as the first bonding pad unit 231 can be physically and/or electrically connected to the second bonding pad unit 311.

The first offset distance OD1 will hereinafter be described. The second and third FPCs 230 and 310 may be formed so that the first offset distance OD1 is greater than 0.

The first offset distance OD1 may be defined as a spacing distance, on a plane, between a first pad DP1, which is disposed in the first bonding pad unit 231 of the second FPC 230, and a second pad DP2, which is disposed in the second bonding pad unit 311 of the third FPC 310 and is electrically connected to the first pad DP1.

The first and second pads DP1 and DP2 may be electrically connected to each other during bonding. The criterion for determining the spacing distance is not particularly limited. For example, the spacing distance may be a minimum distance between a first side of the first pad DP1 and a first side of the second pad DP2.

The first offset distance OD1 will hereinafter be described in further detail with reference to FIGS. 11 through 14. FIGS. 11(a), 12(a), 13(a), and 14(a) are side cross-sectional views of the display device of FIG. 10, as viewed from a third direction d3. FIGS. 11(b), 12(b), 13(b), and 14(b) are views of second and third FPCs 230 and 310 in a state of being electrically connected to the third and fifth output pad units (221 of FIGS. 6 and 301 of FIG. 8), respectively, as projected on a plane. In FIGS. 11 through 14, like reference numerals indicate like elements.

Referring to FIG. 11, a length l1 of the second FPC 230 may be smaller than a length l2 of the third FPC 310, and this means that the third FPC 310 protrudes beyond the second FPC 230 in a first direction d1. Accordingly, a first imaginary line c11 extended from the first pad DP1 of the first bonding pad unit 231 in a fourth direction d4 and a second imaginary line c12 extended from the second pad DP2 of the second bonding pad unit 311 in the fourth direction d4 are apart from each other on a plane. That is, the second and third FPCs 230 and 310 are formed so as for the first offset distance OD1 to be greater than zero.

Referring to FIG. 12, a length l3 of the second FPC 230 may be greater than, or the same as, a length l4 of the third FPC 310, but regardless of this, the third FPC 310 protrudes beyond the second FPC 230 in the first direction d1. This means that the third FPC 310 is disposed on the pressure sensing member 300 to protrude beyond the second FPC 230 in the first direction d1.

Accordingly, the first and second imaginary lines c11 and c12 extended from the first and second pads DP1 and DP2, respectively, in the fourth direction d4 are apart from each other on a plane, which means that the first offset distance OD1 between the first and second pads DP1 and DP2 is not zero. That is, the second and third FPCs 230 and 310 are formed so that the first offset distance OD1 is greater than zero.

Referring to FIG. 13, the number of pads included in the second bonding pad unit 311 may be greater than the number of pads included in the first bonding pad unit 231. Also, the first pad DP1 is disposed at an outermost portion of the first bonding pad unit 231, but the second pad DP2 is not disposed at an outermost portion of the second bonding pad unit 311. Even in this case, a spacing distance is formed on a plane between the first and second imaginary lines c11 and c12 extended from the first and second pads DP1 and DP2, respectively, in the fourth direction d4. The spacing distance is not zero. Accordingly, the second and third FPCs 230 and 310 are formed so that the first offset distance OD1 between the first and second pads DP1 and DP2 is not zero.

Referring to FIG. 14, the second and third FPCs 230 and 310 may have different shapes. Even in this case, the first and second imaginary lines c11 and c12 extended from the first and second pads DP1 and DP2, respectively, in the fourth direction d4 are apart from each other on a plane. Accordingly, the second and third FPCs 230 and 310 are formed so as for the first offset distance OD1 between the first and second pads DP1 and DP2 to be greater than zero.

In short, the first offset distance OD1 is defined as a spacing distance, on a plane, between two imaginary lines, which are extended from pads that are to be electrically connected during bonding, before bonding and folding. The display device 10 may be formed so as for the first offset distance OD1 between the first and second pads DP1 and DP2 to be greater than zero. In one exemplary embodiment, the first offset distance OD1 may be about 500 um to 1000 um.

That is, the second and third FPCs 230 and 310 may not necessarily have the same shape, width, thickness, and/or length.

Referring to FIGS. 11 through 14, the first offset distance OD1 is limited to only a case where the first imaginary line c11 is located on the left side of the second imaginary line c12. That is, the first offset distance OD1 does not encompass the spacing distance, on a plane, between the first and second imaginary lines c11 and c12 when the first imaginary line c11 is located on the right side of the second imaginary line c12. This means that the length of the third FPC 310, which is disposed below the display unit 110, from one side of the display panel 100 is greater than the length of the second FPC 230, which is disposed above the display unit 110, from the corresponding side of the display panel 100.

The second step, which is a step after the bending of the second and third FPCs 230 and 310, will hereinafter be described with reference to FIGS. 15 through 17.

Figure 15:
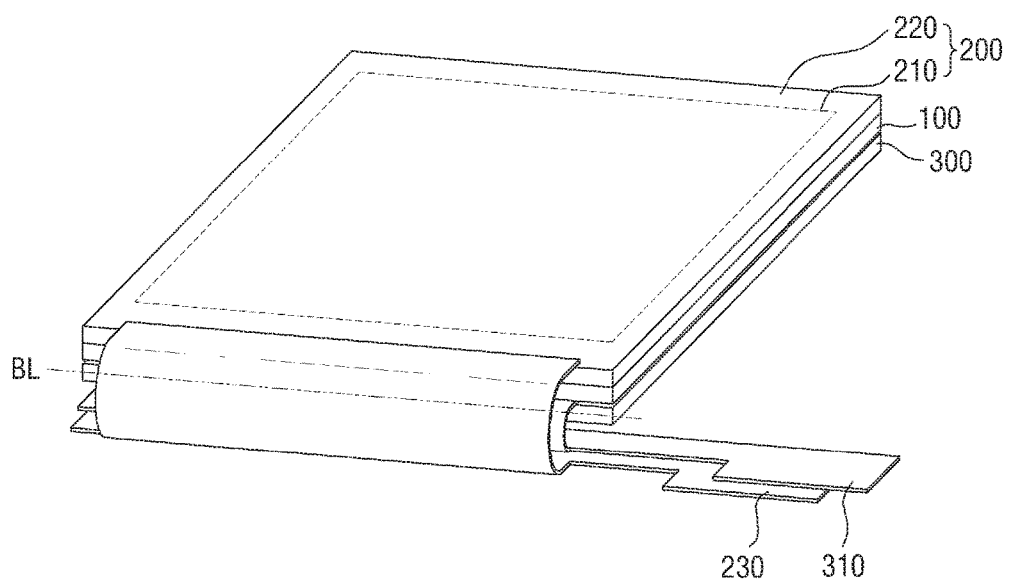
FIG. 15 is a perspective view of the display device according to the exemplary embodiment of FIG. 1 with second and third flexible printed circuits (FPCs) bent along an imaginary first bending line.

FIG. 15 is a perspective view of the display device according to the exemplary embodiment of FIG. 1 with the second and third FPCs bent along an imaginary first bending line. FIG. 16 is a rear view of the display device of FIG. 15. FIG. 17 shows views of the second and third FPCs of FIG. 16 as projected on a plane. For convenience, FIGS. 15 through 17 mainly show the input sensing member 200, the second FPC 230, the pressure sensing member 300, and the third FPC 310.

Figure 16:
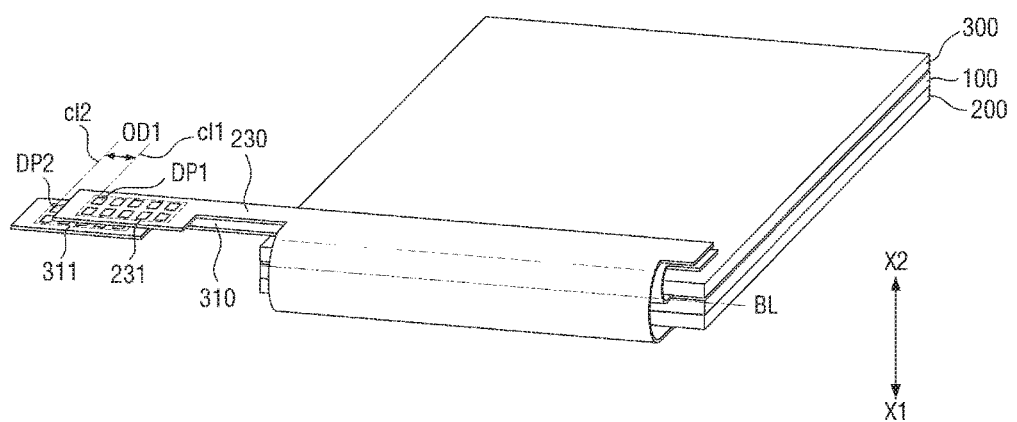
FIG. 16 is a rear view of the display device of FIG. 15.

Referring to FIGS. 15 and 16, the second and third FPCs 230 and 310 may be bent along an imaginary bending line BL. The central axis of a bending area of each of the second and third FPCs 230 and 310 may be disposed on the imaginary bending line BL.

After the bending of the second and third FPCs 230 and 310, the second and third FPCs 230 and 310 at least partially overlap with, and face, each other. The bending of the second and third FPCs 230 and 310 to overlap with each other has already been described above, and thus, a detailed description thereof will be omitted.

The second and third FPCs 230 and 310 may be formed so as for the first offset distance OD1 to be greater than zero, even after their being bent.

Figure 17:
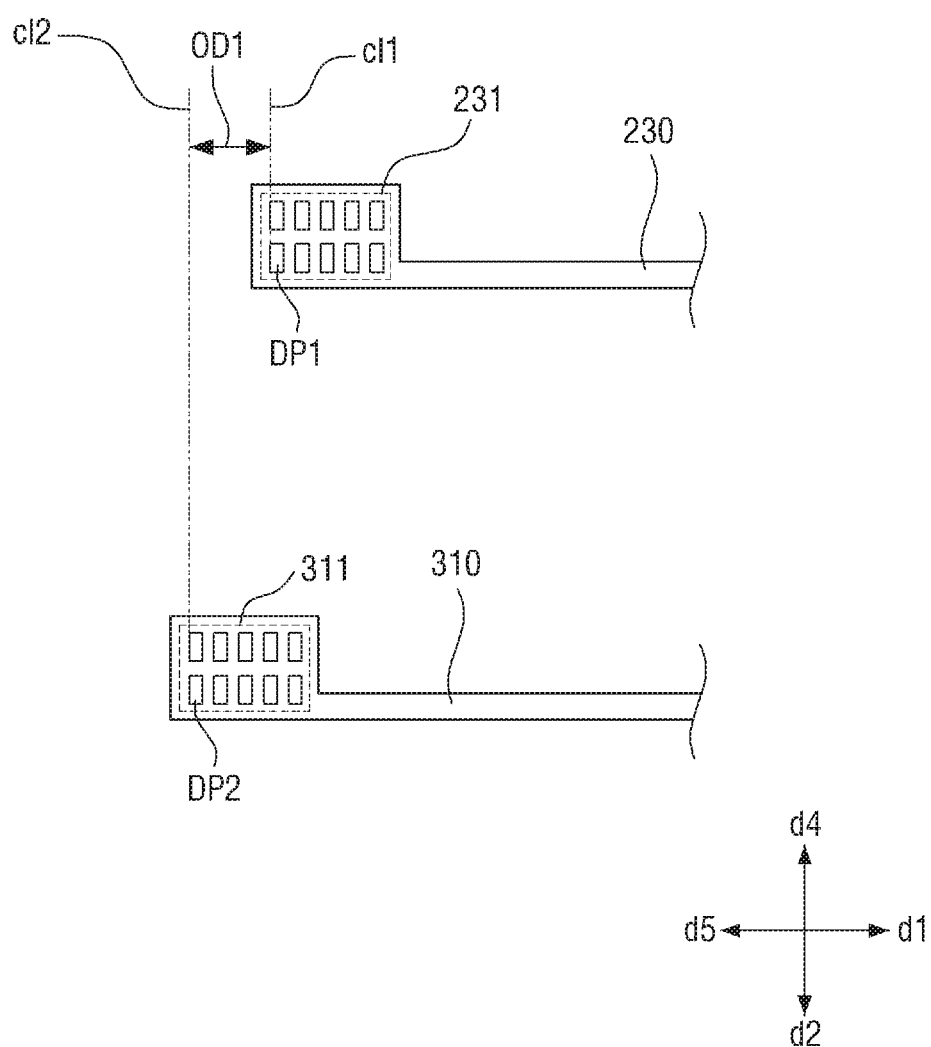
FIG. 17 shows views of the second and third FPCs of FIG. 16 as projected on a plane.

Referring to FIG. 17, after the bending of the second and third FPCs 230 and 310, the third FPC 310 protrudes beyond the second FPC 230 in a fifth direction d5. That is, the first and second imaginary lines c11 and c12 extended from the first and second pads DP1 and DP2, respectively, in the fourth direction d4 are a predetermined distance apart from each other on a plane, and this means that the first offset distance OD1 is greater than zero.

The third step of bonding the first and second bonding pad units 231 and 311 will hereinafter be described with reference to FIGS. 18 and 19.

Figure 18:
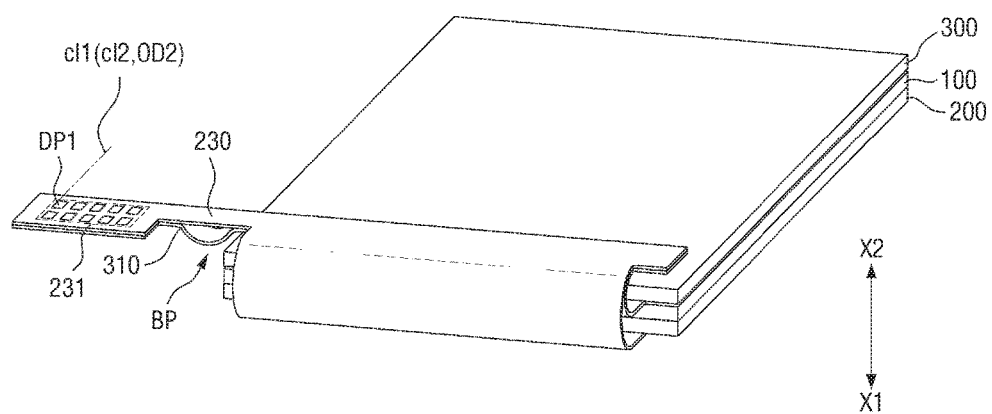
FIG. 18 is a perspective view of the display device of FIG. 15 with the first and second bonding pad units bonded together.

FIG. 18 is a perspective view of the display device of FIG. 15 with the first and second bonding pad units bonded together. FIG. 19 is a side view illustrating the second and third FPCs to which the first and second bonding pad units are bonded.

Figure 19:
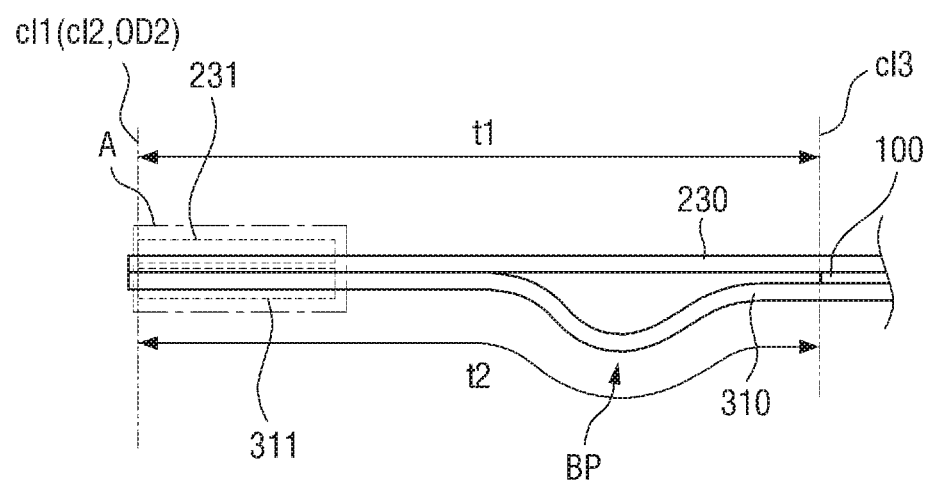
FIG. 19 is a side view illustrating the second and third FPCs to which the first and second bonding pad units are bonded.

Referring to FIGS. 18 and 19, the first and second bonding pad units 231 and 311 may be electrically bonded together. A bonding method used to bond the first and second bonding pad units 231 and 311 is not particularly limited as long as it can electrically connect the first and second bonding pad units 231 and 311. In one exemplary embodiment, the first and second bonding pad units 231 and 311 may be bonded together by thermal fusion using a hot bar. In another exemplary embodiment, the first and second bonding pad units 231 and 31 may be electrically connected to each other using an ACF.

Referring to an area A of FIG. 19, the first and second bonding pad units 231 and 311 may be bonded so as for a second offset distance OD2 to become substantially zero.

The second offset distance OD2 may be defined as a spacing distance between the first and second imaginary lines c11 and c12, which are extended from the first and second pads DP1 and DP2, respectively, in the fourth direction d4, after the bonding of the first and second bonding pad units 231 and 311, i.e., after the electrically connecting of the first and second pads DP1 and DP2.

Accordingly, when the second offset distance OD2 is substantially zero, the first and second imaginary lines c11 and c12 almost coincide with each other. The second offset distance OD2 does not consider a spacing distance formed by misalignment that may occur during the bonding of the first and second pads DP1 and DP2.

In a case where the first and second bonding pad units 231 and 311 are bonded so as for the second offset distance OD2 to become zero, the third FPC 310 includes a bent portion BP. The bent portion BP may be defined as a region not properly placed in contact with the second FPC 230. The bent portion BP may also be referred to as a bulging or buckling portion. That is, before folding, by bonding the first and second bonding pad units 231 and 311 having the first offset distance OD1 therebetween, the bent portion BP may be intentionally formed. Due to a height difference formed by part of the display panel 100 disposed between the first and second bonding pad units 231 and 311, another bent portion may be formed during the bonding of the first and second bonding pad units 231 and 311. The term "bent portion", as used herein, may include not only a bent portion formed due to a height difference, but also the bent portion BP intentionally formed by bonding the first and second bonding pad units 231 and 311 having the first offset distance OD1 therebetween.

The bent portion BP is removed during the folding of the first and second bonding pad units 231 and 311, i.e., the fourth step, which will be described later. That is, during the folding of the first and second bonding pad units 231 and 311, any bulging portions that are not placed in contact with, but lifted off of, the display panel 100, are removed.

The relationship between the display panel 100 and the first and second bonding pad units 231 and 311 that are bonded together may be defined as follows. A length t1 from a third imaginary line c13 extended along one side of the display panel 100, which is illustrated in FIG. 19 as being thinner that it is supposed to be, to a first imaginary line c11 extended from one side of the first pad DP1 is smaller than a length t2 from the third imaginary line c13 to a second imaginary line c12 extended from one side of the second pad DP2. The lengths t1 and t2 may not necessarily be the distances between straight lines, but the lengths of lines extended along the sides of the second and third FPCs 230 and 310. The third imaginary line c13 may not necessarily be defined as a line extended along one side of the display panel 100 and may be defined as a line extended along one side of the input sensing member 200 or the pressure sensing member 300.

That is, the lengths of the first and second pads DP1 and DP2 from a particular starting point differ from each other. Specifically, the length of the second pad DP2 from the particular starting point may be greater than the length of the first pad DP1 from the particular starting point.

The second FPC 230 may further include an adhesive area 233 in which an adhesive member is disposed. The adhesive area 233 may be defined as an area in which the first and second bonding pad units 231 and 311 that are bonded are folded and adhered to each other. In one exemplary embodiment, the adhesive area 233 may be an area in which a PSA is disposed.

The fourth step of folding the first and second bonding pad units 231 and 311 that are bonded will hereinafter be described with reference to FIG. 20.

Figure 20:
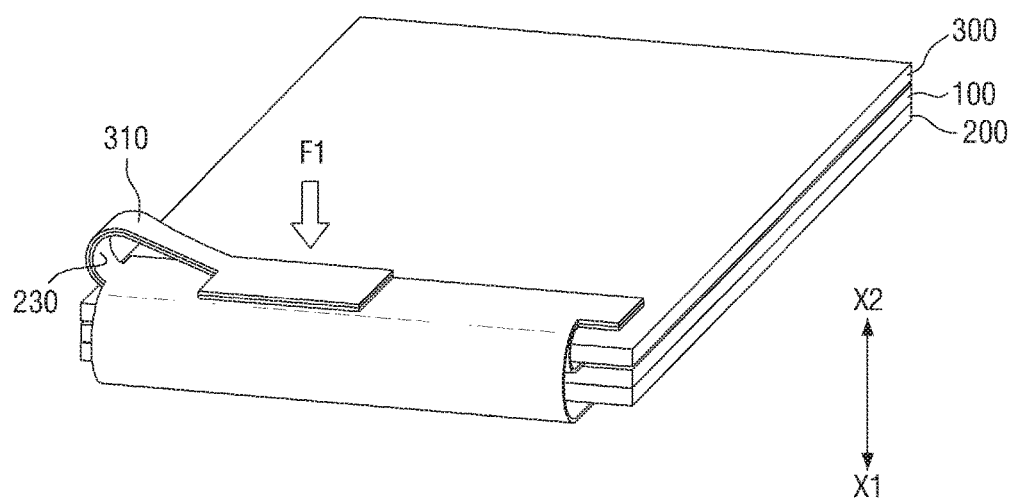
FIG. 20 is a perspective view of the display device of FIG. 18 with the first and second bonding pad units folded.

FIG. 20 is a perspective view of the display device of FIG. 18 with the first and second bonding pad units folded.

Referring to FIGS. 19 and 20, the second and third FPCs 230 and 310 to which the first and second bonding pad units 231 and 311 are bonded are folded downwardly toward the bottom of the display device 10 along an imaginary folding line FL.

Specifically, the second and third FPCs 230 and 310 folded along the imaginary folding line FL are attached to the adhesive area 233 of the second FPC 230 via the adhesive member, and may be bonded to the adhesive area 233 by applying pressure F1. In one exemplary embodiment, at least part of the first bonding pad unit 231 may be bonded to the adhesive area 233.

As described above, the second and third FPCs 230 and 310 may be attached to the adhesive area 233 with the bent portion BP removed therefrom. Accordingly, cracks that may be formed in the second and third FPCs 230 and 310 during the application of the pressure F1 can be prevented, and the first and second bonding pad units 231 and 311 can be prevented from being lifted off due to the presence of any bulging portion.

The bending and folding of the first and second bonding pad units 231 and 311 have been described above, taking the second and third FPCs 230 and 310, but the present disclosure is not limited thereto. That is, if the input sensing member 200 and the pressure sensing member 300 are flexible, the second and third FPCs 230 and 310 may not be provided, and the first and second bonding pad units 231 and 311 may be disposed on the bending areas of the input sensing member 200 and the pressure sensing member 300, respectively.

The input sensing member 200 has been described above as being disposed above the display panel 100, and the pressure sensing member 300 has been described above as being disposed below the display panel 100. Alternatively, the pressure sensing member 300 may be disposed above the display panel 100, and the input sensing member 200 may be disposed below the display panel 100, in which case, the first bonding pad unit 231 of the second FPC 230 may be formed to protrude beyond the second bonding pad unit 311 of the third FPC 310. In one exemplary embodiment, in a case where the pressure sensing member 300 is disposed on the display panel 100, the pressure sensing member 300 may include a plurality of pressure sensing lines formed as transparent electrodes, or a plurality of pressure sensing lines may be formed to overlap with the non-display area NDA.

The pressure sensing member 300 may be replaced with a functional layer. The functional layer may perform a heat dissipation function, an electromagnetic shielding function, a pattern visibility prevention function, a grounding function, a buffer function, a reinforcement function, and/or a digitizing function. The functional layer may be provided in various forms such as a layer, a film, a sheet, a plate, or a panel.

For example, the pressure sensing member 300 may be replaced with a digitizer, which is a type of input device. The digitizer, unlike other input devices such as a keyboard or a mouse, receives information regarding a position on a screen, designated by a user. The digitizer recognizes the movement of, for example, a stylus pen, and converts the recognized movement into a digital signal. The digitizer may be provided in the form of a thin film or a panel.

While exemplary embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further exemplary embodiments of the present disclosure.

What is claimed is:

1. A display device, comprising:
   an input sensing member electrically connected to a first bonding pad unit, the first bonding pad unit having a first pad;
   a pressure sensing member electrically connected to a second bonding pad unit, the second bonding pad unit having a second pad; and
   a display panel disposed between the input sensing member and the pressure sensing member,
   wherein
   the first pad is configured to be electrically connected to the second pad,
   a first offset distance between the first and second pads is greater than zero, and
   the first offset distance is defined as a spacing distance, on a plane, between a side of the first pad and a side of the second pad when the first and second pads are not electrically connected.

2. The display device of claim 1, wherein a length from an imaginary line, extended from a side of the display panel in an upward direction of the display panel, to the first pad is smaller than a length from the imaginary line to the second pad.

3. The display device of claim 1, wherein the first offset distance is 500 um to 1000 um.

4. The display device of claim 1, wherein
   a second offset distance between the first and second pads is zero, and
   the second offset distance is defined as a spacing distance, on the plane, between the side of the first pad and the side of the second pad when the first and second pads are electrically connected.

5. The display device of claim 1, further comprising:
   a first flexible printed circuit (FPC) on which the first bonding pad unit is disposed; and
   a second FPC on which the second bonding pad unit is disposed,
   wherein the second FPC is configured to have a bent portion when the first and second bonding pad are not folded.

6. The display device of claim 2, wherein the second FPC is configured not to have the bent portion when the first and second bonding pad are not folded.

7. The display device of claim 1, wherein the first and second pads are electrically connected by hot bar bonding.

8. The display device of claim 1, further comprising:
   a plurality of pixel units disposed on a display area; and
   an encapsulation member disposed to cover the pixel units,
   wherein the encapsulation member either includes at least one of an organic layer and an inorganic layer or is a glass insulating substrate.

9. The display device of claim 1, wherein the display panel is one of an organic light-emitting display panel and a liquid crystal display (LCD) panel.

10. The display device of claim 1, wherein
    the display panel includes a substrate having a display area configured to display an image and a non-display area adjacent to the display area,
    the display panel further includes a bending area disposed on the substrate and overlapping with the non-display area, and
    the substrate is bent along an imaginary bending axis disposed in the bending area.

11. A display device, comprising:
    a display panel;
    an input sensing member disposed above the display panel and including a first bonding pad unit having a first pad; and
    a pressure sensing member disposed below the display panel and including a second bonding pad unit having a second pad, the second pad configured to be electrically connected to the first pad,
    wherein a first length from an imaginary line, extended from a side of the display panel in an upward direction of the display panel, to the first pad is smaller than a second length from the imaginary line to the second pad.

12. The display device of claim 11, wherein
    the input sensing member includes a first FPC on which the first bonding pad unit is disposed and a second FPC on which the second bonding pad unit is disposed,
    the first length is defined as a length from the imaginary line to the first pad along a side of the first FPC, and
    the second length is defined as a length from the imaginary line to the second pad along a side of the second FPC.

13. The display device of claim 11, wherein
    the first offset distance between the first and second pads is greater than zero, and
    the first offset distance is defined as a spacing distance, on a plane, between a side of the first pad and a side of the second pad when the first and second pads are not be electrically connected.

14. The display device of claim 13, wherein the first offset distance is 500 um to 1000 um.

15. The display device of claim 11, wherein
    a second offset distance between the first and second pads is zero, and
    the second offset distance is defined as a spacing distance, on the plane, between the side of the first pad and the side of the second pad when the first and second pads are electrically connected.

16. The display device of claim 11, further comprising:

a first FPC on which the first bonding pad unit is disposed; and a second FPC on which the second bonding pad unit is disposed, wherein the second FPC is configured to have a bent portion when the first and second bonding pad are not folded.

17. A manufacturing method of a display device, comprising:

preparing an input sensing member electrically connected to a first bonding pad unit having a first pad, a pressure sensing member electrically connected to a second bonding pad having a second pad, the second pad being spaced apart from the first pad on a plane, and a display panel disposed between the input sensing member and the pressure sensing member;

electrically connecting the first and second pads; and folding the first and second pads that are electrically connected.

18. The manufacturing method of claim 17, wherein a length from an imaginary line, extended from a side of the display panel in an upward direction of the display panel, to the first pad is smaller than a length from the imaginary line to the second pad.

19. The manufacturing method of claim 17, further comprising:

preparing a first FPC on which the first bonding pad unit is disposed and a second FPC on which the second bonding pad unit is disposed, wherein the second FPC has a bent portion before the folding the first and second pads that are electrically connected.

20. The manufacturing method of claim 19, wherein the second FPC no longer has the bent portion after the folding the first and second pads that are electrically connected.

* * * * *